US007538608B2

(12) United States Patent
Chen et al.

(10) Patent No.: US 7,538,608 B2

(45) Date of Patent: May 26, 2009

(54) PHOTONIC CRYSTAL RIBBON-BEAM TRAVELING WAVE AMPLIFIER

(75) Inventors: Chiping Chen, Needham, MA (US); Bao-Liang Qian, Quincy, MA (US); Richard J. Temkin, Needham, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 756 days.

(21) Appl. No.: 10/870,116

(22) Filed: Jun. 17, 2004

(65) Prior Publication Data

US 2005/0062424 A1 Mar. 24, 2005

Related U.S. Application Data

(60) Provisional application No. 60/483,852, filed on Jun. 30, 2003.

(51) Int. Cl.
*H03F 3/58* (2006.01)

(52) U.S. Cl. .......................... 330/43; 315/3.5; 315/39.3

(58) Field of Classification Search .................. 330/43; 315/3.5, 39.3
See application file for complete search history.

(56) References Cited

U.S. PATENT DOCUMENTS

| | | | | |
|---|---|---|---|---|
| 3,264,514 | A | | 8/1966 | Udelson |
| 3,732,456 | A | * | 5/1973 | Buck ............................. 315/3 |
| 3,781,702 | A | | 12/1973 | Jasper, Jr. |
| 3,787,747 | A | | 1/1974 | Scott |
| 3,980,919 | A | | 9/1976 | Bates et al. |
| 3,982,152 | A | * | 9/1976 | Smith ......................... 315/3.6 |
| 4,017,805 | A | * | 4/1977 | Wagner ...................... 330/308 |
| 4,590,596 | A | * | 5/1986 | Wortman et al. ............... 372/2 |
| 4,888,776 | A | | 12/1989 | Dolezal et al. |
| 5,227,701 | A | * | 7/1993 | McIntyre .................. 315/5.41 |
| 5,568,014 | A | * | 10/1996 | Aoki et al. .................. 315/3.5 |
| 6,664,734 | B1 | | 12/2003 | Jasper, Jr. |
| 2002/0190655 | A1 | | 12/2002 | Chen et al. |

FOREIGN PATENT DOCUMENTS

WO 03021734 3/2003

OTHER PUBLICATIONS

"Pierce-type dispersion relation for an intense relativistic electron beam interacting with a slow-wave structure," Chen et al. *Phys. Plasmas I.* Jan. 1004. p. 167-170.

"Chaotic electron dynamics for relativistic-electron-beam propagation through a planar wiggler magnetic field," Chen et al. *Physical Review A.* Oct. 1990. vol. 42, No. 8.

"Modal analysis and gain calculations for a sheet electron beam in a ridged waveguide slow-wave structure," Chen et al. *Physics of Plasmas.* Dec. 2002, vol. 9, No. 12.

* cited by examiner

*Primary Examiner*—Patricia Nguyen
(74) *Attorney, Agent, or Firm*—Gauthier & Connors LLP

(57) ABSTRACT

A RF amplifier includes a RF input section for receiving a RF input signal. At least one single-sided slow-wave structure is associated with the RF interaction section. An electron ribbon beam that interacts with the RF input supported by the at least one single-sided slow-wave structure so that the kinetic energy of the electron beam is transferred to the RF fields of the RF input signal, thus amplifying the RF input signal. A RF output section outputs the amplified RF input signal.

16 Claims, 23 Drawing Sheets

PHOTONIC CRYSTAL RIBBON-BEAM TRAVELING WAVE AMPLIFIER

PRIORITY INFORMATION

This application claims priority from provisional application Ser. No. 60/483,852 filed Jun. 30, 2003, which is incorporated herein by reference in its entirety.

This invention was made with government support under Grant No. F49620-03-1-0230 awarded by the Air Force. The government has certain rights in the invention.

BACKGROUND OF THE INVENTION

The invention relates to the field of optical communication, and in particular to a photonic crystal ribbon-beam traveling wave amplifier.

The third-generation (3G) wireless communication standards call for hardware-based upgrade to the second-generation (2G) Global Systems for Mobile Communications using Wideband Code Division Multiple Access (W-CDMA) and Universal Mobile Telephone System (UMTS) as well as software-based upgrade to 2G Code Division Multiple Access (CDMA). The 3G wireless communications require amplifiers operating frequencies that are 1.12 to 3 times that of present frequencies, which are in the range from 900 MHz to 1700 MHz.

In general, the bandwidth of a transmitter, which is the most important figure of merit, increases with the central frequency of the amplifier. However, the number of transmitting towers must increase as the square of the central frequency, while keeping the power of the transmitting tower at a constant. This is because the distance between two adjacent transmitting towers is inversely proportional to the frequency. For example, if 1-GHz transmitting towers have a spacing of 10 miles, then 2-GHz transmitting towers must have a spacing of 5 miles. In other words, four 2-GHz transmitting towers are required to cover 100 square miles, whereas only one 1-GHz transmitting tower is needed for the same area.

Moreover, the total RF power per unit area increases with increasing data rate. For example, 3G wireless networks are expected to have considerably higher data rate than 2G wireless networks. As a result, the number of power amplifiers increases more dramatically than the square of the carrier frequency.

In order for the third-generation (3G) and future wireless communications to be a viable business, it is essential for the telecommunication equipment industry to provide ultra-low-cost amplifiers.

At present, most wireless base stations are powered by solid-state power amplifiers, which operate with efficiencies in the 8-12% range. The cost of solid-state amplifier is about $100/Watt. The cost of power amplifiers per base station at 1.5 kW is $150,000. For the RF power part of a wireless base station, the operating cost is comparable to the capital cost, because of the low operating efficiencies and heat removal.

Conventional helix traveling wave tubes (TWTs), which are not employed in any existing wireless base stations, cannot meet the ultra-low-cost requirement set by any potential third-generation wireless infrastructure provider. For example, a 100 W, 2 GHz conventional helix TWT costs $20K a piece or more.

There is a need to develop high efficiency, low-cost microwave amplifiers for 3G and future wireless base stations.

SUMMARY OF THE INVENTION

According to one aspect of the invention, there is provided a RF amplifier. The RF amplifier includes a RF input section for receiving a RF input signal. At least one slow-wave structure associated with the RF interaction section. An electron ribbon beam interacts with the RF input supported by the at least one slow-wave structure so that the kinetic energy of the electron beam is transferred to the RF fields of the RF input signal, thus amplifying the RF input signal. A RF output section outputs the amplified RF input signal.

According to another aspect of the invention, there is provided a method of forming a RF amplifier. The method includes forming RF input section for receiving a RF input signal. Also, the method includes forming al least one photonic crystal for operational control if necessary. An electron ribbon beam is formed that interacts with the RF input supported by the at least one slow-wave structure so that the kinetic energy of the electron beam is transferred to the RF fields of the RF input signal, thus amplifying the RF input signal. Furthermore, the method includes forming a RF output section that outputs the amplified RF input signal.

DETAILED DESCRIPTION OF THE INVENTION

The invention is a novel amplifier that employs two emerging technologies, namely, photonic crystals and low-density ribbon electron beams, in otherwise a conventional vacuum tube millimeter wave amplifier.

Figure 1A:
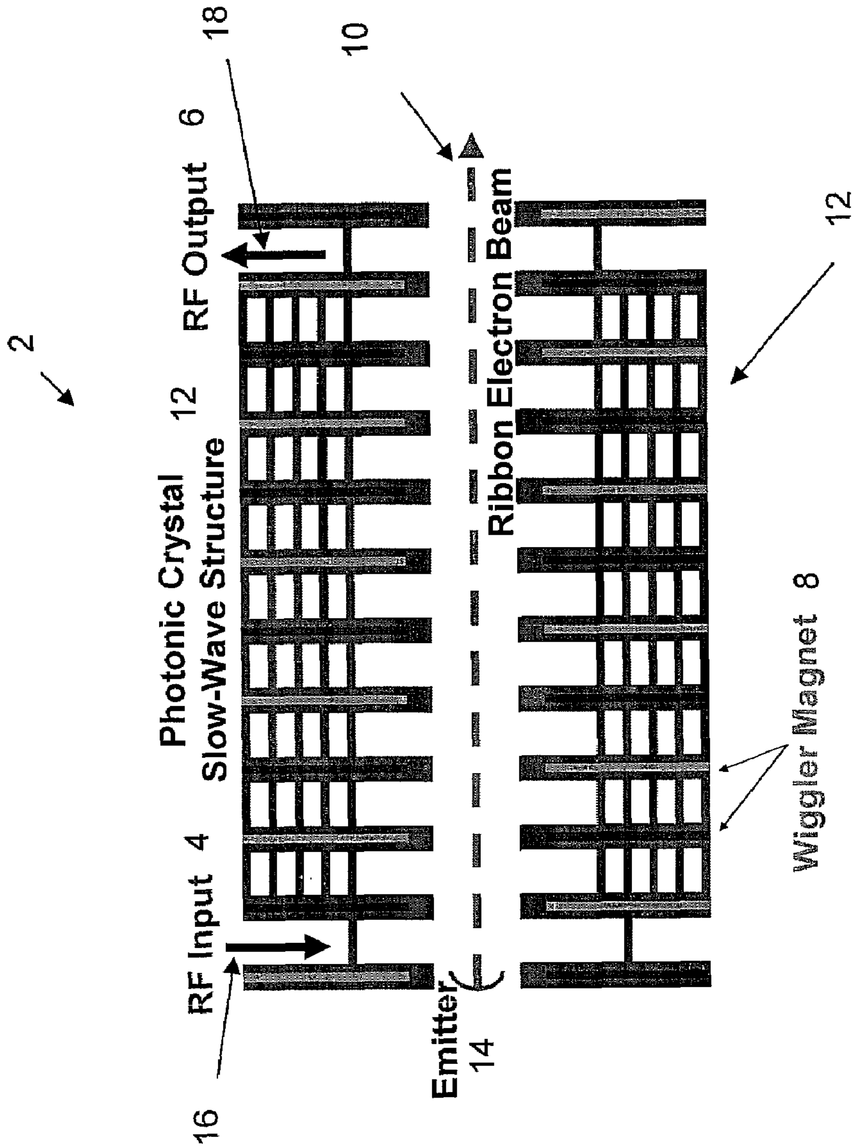
FIGS. 1A-1B are schematic diagrams of a photonic crystal ribbon-beam traveling wave amplifier (PCRB TWA) in accordance with the invention.
Figure 1B:
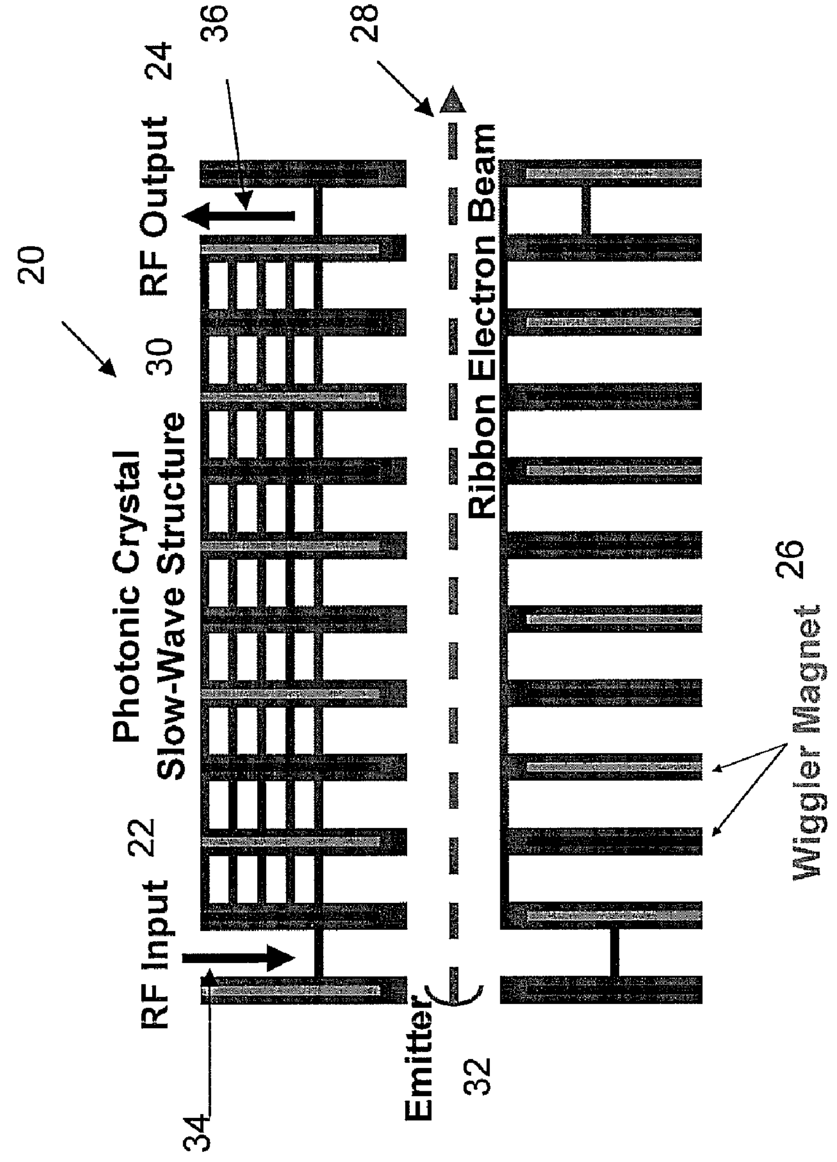

FIGS. 1A-1B shows a schematic diagram of a photonic crystal ribbon-beam traveling wave amplifier (PCRB TWA) 2 in accordance with the invention. FIG. 1A shows a double sided PCRB TWA 2 that includes a ribbon electron beam 10 propagating in the z-direction from the emitter 14 and extending out, wiggler magnets 8 for beam focusing, a photonic crystal (PC) slow-wave structure 12 with metallic or dielectric rods and plates, and RF input 4 and output 6 sections. As the electron beam 10 interacts with the RF input 4 supported by slow-wave structure 12, the kinetic energy of the electron beam is transferred to the RF fields, amplifying the RF signal 16. The amplified RF signal 18 exits the amplifier at the RF output 6, and the spent electron beam is collected down stream.

FIG. 1B shows a single sided PCRB TWA 20 that includes a ribbon electron beam 28 propagating in the z-direction from the emitter 32 and extending out, wiggler magnets 26 for beam focusing, a photonic crystal (PC) slow-wave structure 30 with metallic or dielectric rods and plates, and RF input 22 and output 24 sections. As the electron beam 28 interacts with the RF input signal 34 supported by slow-wave structure 30, the kinetic energy of the electron beam 28 is transferred to the RF fields, amplifying the RF signal 34 to produce the amplified signal 36.

Unlike the round beams in conventional helix or coupled-cavity TWTs, the ribbon electron beam in the PCRB TWA will reduce the magnetic field required for beam focusing, reduce the loading in the amplifier, increase the amplifier efficiency, and improve the amplifier linearity and bandwidth.

The ribbon beam will have an aspect ratio of 1 to 10, which effectively lowers the beam perveance (or space-charge) by a factor of 10 in comparison with a round beam. Based on the well-known empirical scaling law, the efficiency of the PCRB TWA is expected to be as high as 80%. Furthermore, because the effective beam perveance is small, the interaction between the electrons and slow-wave structure is expected to be high. Consequently, a high degree of linearity of the amplifier is expected in the high-efficiency operation.

Figure 2:
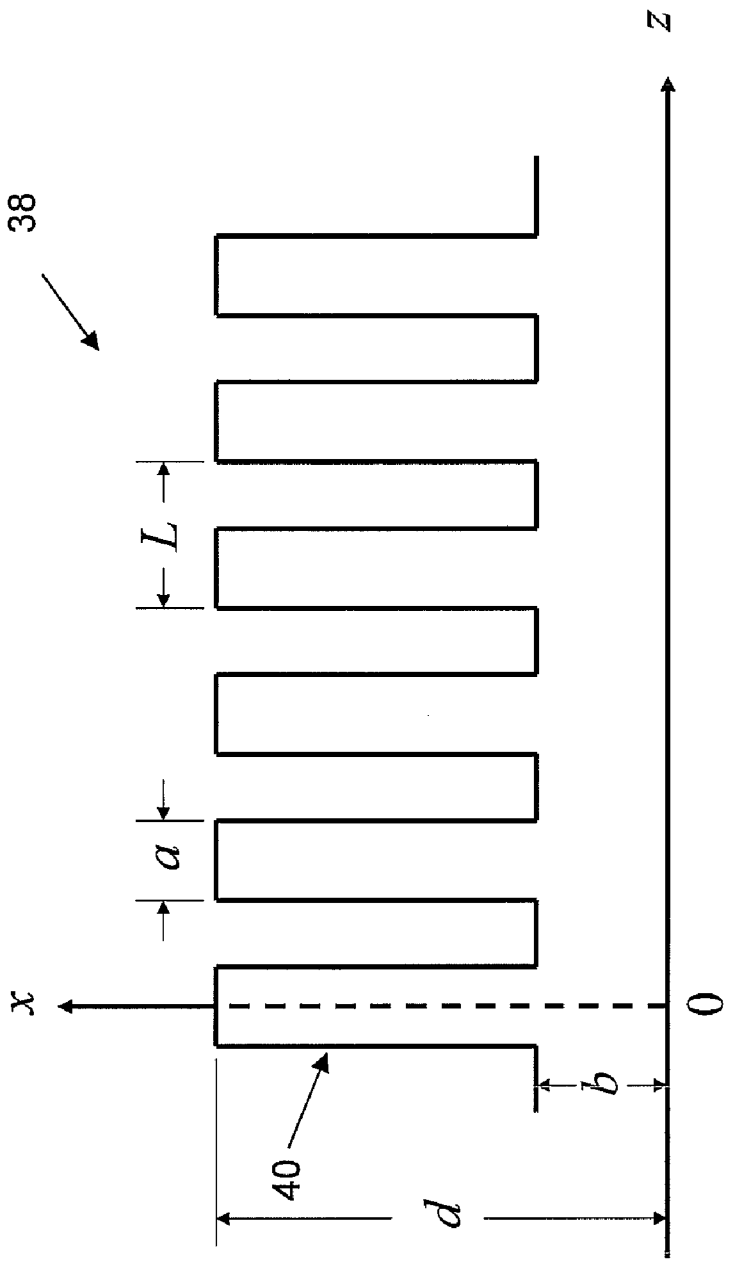
FIG. 2 is a schematic diagram illustrating a detailed depiction of a single-sided slow-wave structure.

Consider a monochromatic electromagnetic wave propagating in the two-dimensional single-sided slow-wave structure 38 as shown in FIG. 2. The slow-wave structure 38 consists of a metal plate at x=0 and corrugated vanes 40 located between x=b and d. The period of corrugation is L, and the width of each vane is a. For simplicity, either the periodic metal or dielectric rods that are placed at $x \geqq d$ in the PCRB TWA or the variations in the y-direction is considered. Moreover, the transverse magnetic (TM) modes are of importance with the field distributions $$E(x,z,t)=e^{-i\omega t}[E_x(x,z)\hat{e}_x+E_z(x,z)\hat{e}_z], \quad \text{Eq. 1}$$

$$B(x,z,t)=e^{-i\omega t}B_y(x,z)\hat{e}_y. \quad \text{Eq. 2}$$

where E(x,z,t) is the electric field, $E_x(x,z)$ is the electric in the x-direction, $E_z(x,z)$ is the electric field in the y-direction, B(x,z,t) is the magnetic field, and treat $B_y(x,z)$ as the generating function. The wave equation can be expressed as $$\left(\frac{\partial^2}{\partial x^2}+\frac{\partial^2}{\partial z^2}\right)B_y(x,z)+\frac{\omega^2}{c^2}B_y(x,z)=0. \quad \text{Eq. 3}$$

where ω is the frequency of the wave and c is the speed of the light. In cgs units, the electric field can be expressed as $$E_x(x,z)=\frac{c}{i\omega}\frac{\partial}{\partial z}B_y(x,z), \quad \text{Eq. 4}$$

$$E_z(x,z)=-\frac{c}{i\omega}\frac{\partial}{\partial x}B_y(x,z). \quad \text{Eq. 5}$$

Expressing the generating function as a Bloch-wave function of the form $$B_y(x,z,t)=e^{i(k_zz-\omega t)}\sum_{n=-\infty}^{\infty}u_n(x)e^{i2\pi nz/L}, \quad \text{Eq. 6}$$

one can rewrite the wave equation as $$\sum_{n=-\infty}^{\infty}\left\{\frac{\partial^2u_n}{\partial x^2}+\left[\frac{\omega^2}{c^2}-\left(k_z+\frac{2\pi n}{L}\right)^2\right]u_n\right\}e^{i2\pi nz/L}=0, \quad \text{Eq. 7}$$

or $$\sum_{n=-\infty}^{\infty}\left\{\frac{\partial^2u_n}{\partial x^2}+P_n^2u_n\right\}e^{i2\pi nz/L}=0, \quad \text{Eq. 8}$$

where $u_n$ is the Floquet amplitude, and $p_n$ is an effective wavenumber.

$$p_n^2=p_n^2(\omega,k_z)=\frac{\omega^2}{c^2}-\left(k_z+\frac{2\pi n}{L}\right)^2. \quad \text{Eq. 9}$$

Note that for $$\frac{\omega^2}{c^2}-\left(k_z+\frac{2\pi n}{L}\right)^2<0, \quad \text{Eq. 10}$$

$p_n$ is imaginary.

In the corrugated-vane region, the usual approximation is adopted $$B_y(x, z, t) \cong iE_0 e^{i(k_z sL-\omega t)}\cos\left[\frac{\omega}{c}(x-d)\right], \qquad \text{Eq. 11}$$

$$E_x(x,z,t) \cong 0, \qquad \text{Eq. 12}$$

$$E_z(x, z, t) \cong E_0 e^{i(k_z sL-\omega t)}\sin\left[\frac{\omega}{c}(x-d)\right] \qquad \text{Eq. 13}$$

for |z−sL|<a/2 and b<x<d. Here, s=0, ±1, ±2, . . . Note that Eq. 13 assures $E_z|_{x=d}=0$.

In the drift region with 0<x<b, Eq. 8 implies $$\frac{d^2 u_n}{dx^2} + p_n^2 u_n = 0, \qquad \text{Eq. 14}$$

which has a general solution of the form $$u_n(x) = A_n \sin(p_n x) + B_n \cos(p_n x), \qquad \text{Eq. 15}$$

where $A_n$ and $B_n$ are constants. Because $E_z|_{x=0}=0$, one must have $$A_n = 0, \qquad \text{Eq. 16}$$

or $$u_n(x) = B_n \cos(p_n x). \qquad \text{Eq. 17}$$

Therefore, the RF fields in the drift region can be expressed as $$B_y(x, z, t) = e^{i(k_z z-\omega t)}\sum_{n=-\infty}^{\infty} B_n \cos(p_n x)e^{i2\pi nz/L}, \qquad \text{Eq. 18}$$

$$E_x(x, z, t) = e^{i(k_z z-\omega t)}\sum_{n=-\infty}^{\infty} \frac{c}{\omega}\left(k_z + \frac{2\pi n}{L}\right)B_n \cos(p_n x)e^{i2\pi nz/L}, \qquad \text{Eq. 19}$$

$$E_z(x, z, t) = e^{i(k_z z-\omega t)}\sum_{n=-\infty}^{\infty} \frac{c}{i\omega} p_n B_n \sin(p_n x)e^{i2\pi nz/L} \qquad \text{Eq. 20}$$

for 0<x<b. The amplitudes $B_n$ in the drift region are related to the amplitude $E_0$ in the corrugated-vane region by the continuity of the electric field at x=b, i.e., $$e^{ik_z z}\sum_{n=-\infty}^{\infty} \frac{c}{i\omega} p_n B_n \sin(p_n b)e^{i2\pi nz/L} = \begin{cases} E_0 e^{i(k_z sL)}\sin\left[\frac{\omega}{c}(b-d)\right], & \text{if } |z-sL| < a/2, \\ 0, & \text{otherwise,} \end{cases} \qquad \text{Eq. 21}$$

where s=0, ±1, ±2, . . . Solving Eq. (3.1.21) for $B_n$ yields $$B_n = \frac{\omega}{ic}\frac{abE_0}{L}\frac{\sin\left[\frac{\omega}{c}(d-b)\right]\sin\left[\left(k_z + \frac{2\pi n}{L}\right)\frac{a}{2}\right]}{\left(k_z + \frac{2\pi n}{L}\right)\frac{a}{2}}. \qquad \text{Eq. 22}$$

The vacuum dispersion relation can be derived with matching the Poynting flux at x=b. For present purposes, it is useful to introduce the admittance defined by $$A^{\pm}(\omega, k_z) \equiv \frac{\left.\int_{-L/2}^{L/2} E_z^* B_y\, dz\right|_{x=b\pm 0}}{\left|\int_{-L/2}^{L/2} E_z e^{-ik_z z}\, dz\right|^2_{x=b\pm 0}}. \qquad \text{Eq. 23}$$

Substituting Eqs. 11 and 13 to Eq. 22, one obtains $$A^{+}(\omega, k_z) = \frac{1}{ia}\cot\left[\frac{\omega}{c}(d-b)\right]\frac{\left(\frac{k_z a}{2}\right)^2}{\sin^2\left(\frac{k_z a}{2}\right)}. \qquad \text{Eq. 24}$$

Similarly, substituting Eqs. 18, 20 and 22 into Eq. 23, one obtains $$A^{-}(\omega, k_z) = \sum_{n=-\infty}^{\infty} \frac{i\omega}{cLp_n}\cot(p_n b)\frac{\left(\frac{k_z a}{2}\right)^2}{\sin^2\left(\frac{k_z a}{2}\right)}\frac{\sin^2\left[\left(k_z + \frac{2\pi n}{L}\right)\frac{a}{2}\right]}{\left[\left(k_z + \frac{2\pi n}{L}\right)\frac{a}{2}\right]^2}. \qquad \text{Eq. 25}$$

By setting $$A^{+}(\omega, k_z) = A^{-}(\omega, k_z), \qquad \text{Eq. 26}$$

one arrives at the vacuum dispersion relation $$D_a(\omega, k_z) \equiv \frac{\omega ab}{cL}\sum_{n=-\infty}^{\infty} \frac{\cot(p_n b)}{p_n b}\frac{\sin^2\left[\left(k_z + \frac{2\pi n}{L}\right)\frac{a}{2}\right]}{\left[\left(k_z + \frac{2\pi n}{L}\right)\frac{a}{2}\right]^2} + \cot\left[\frac{\omega}{c}(d-b)\right] = 0 \qquad \text{Eq. 27}$$

for the electromagnetic wave in the single-side slow-wave structure. As pointed out earlier, when inequality of Eq. 10 holds, $p_n$ is imaginary and $$\frac{\cot(p_n b)}{p_n b} = -\frac{\coth(|p_n|b)}{|p_n|b}. \qquad \text{Eq. 28}$$

In general, Eq. 27 must be solved numerically.

Figure 3:
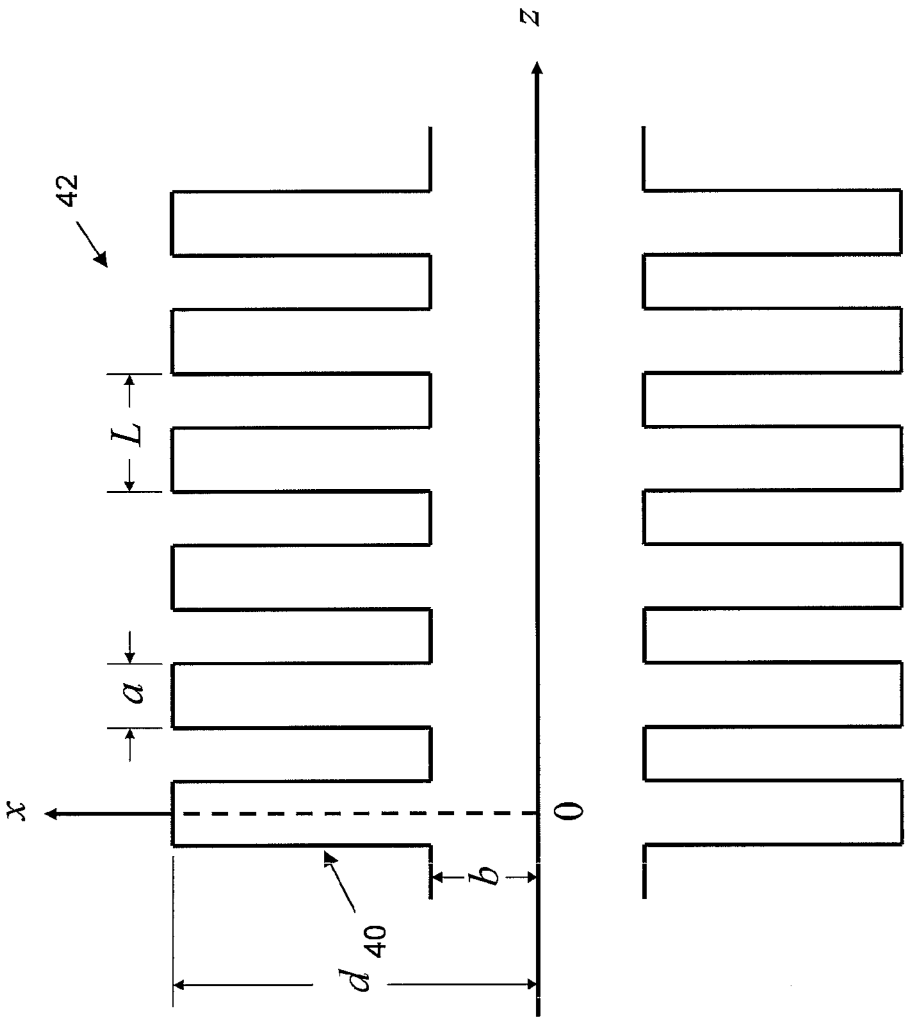
FIG. 3 is a schematic diagram illustrating a detailed depiction of a double-sided slow-wave structure.

As an alternative to the single-side slow-wave structure, a monochromatic wave propagation in a double-side slow-wave structure 42 is considered, as shown in FIG. 3. The bottom of the double-side symmetric slow-wave structure is a mirror image of the top of the single-side slow-wave structure shown in FIG. 2. In the double-side slow-wave structure, however, there is no metal at x=0.

In the double-side slow-wave structure, the vacuum dispersion relation for the anti-symmetric wave propagation with E(−x,z,t)=−E(x,z,t) is the same as the one given in Eq. 27.

However, the vacuum dispersion relation for the symmetric wave propagation with E(−x,z,t)=E(x,z,t) has a difference expression. Paralleling the analysis in Section 3.1, and taking $A_n \neq 0$ and $B_n=0$ in Eq. 15, one can show that it is given by $$D_s(\omega, k_z) = -\frac{\omega ab}{cL}\sum_{n=-\infty}^{\infty}\frac{\tan(p_n b)}{p_n b}\frac{\sin^2\left[\left(k_z+\frac{2\pi n}{L}\right)\frac{a}{2}\right]}{\left[\left(k_z+\frac{2\pi n}{L}\right)\frac{a}{2}\right]^2} + \cot\left[\frac{\omega}{c}(d-b)\right] = 0, \quad \text{Eq. 29}$$

where $p_n$ can be imaginary in which case, $$\frac{\tan(p_n b)}{p_n b} = \frac{\tanh(|p_n|b)}{|p_n|b}. \quad \text{Eq. 30}$$

The mode structures in the double-sided slow-wave structures are qualitatively different from those in the single-sided slow-wave structures, which makes the single-side slow-wave structure suitable for use in a PCRB TWA.

To gain some quantitative understanding of the vacuum dispersion characteristics of electromagnetic wave propagation in the double-side slow-wave structure shown in FIG. 3, consider the first example with the choice of system parameters corresponding to:

L=0.24 cm, $a/L$=0.8, $b/L$=1.0, $d/L$=6.0. Eq. 31

This choice of system parameters can also represent a single-side slow-wave structure that supports only the anti-symmetric modes.

Figure 4A:
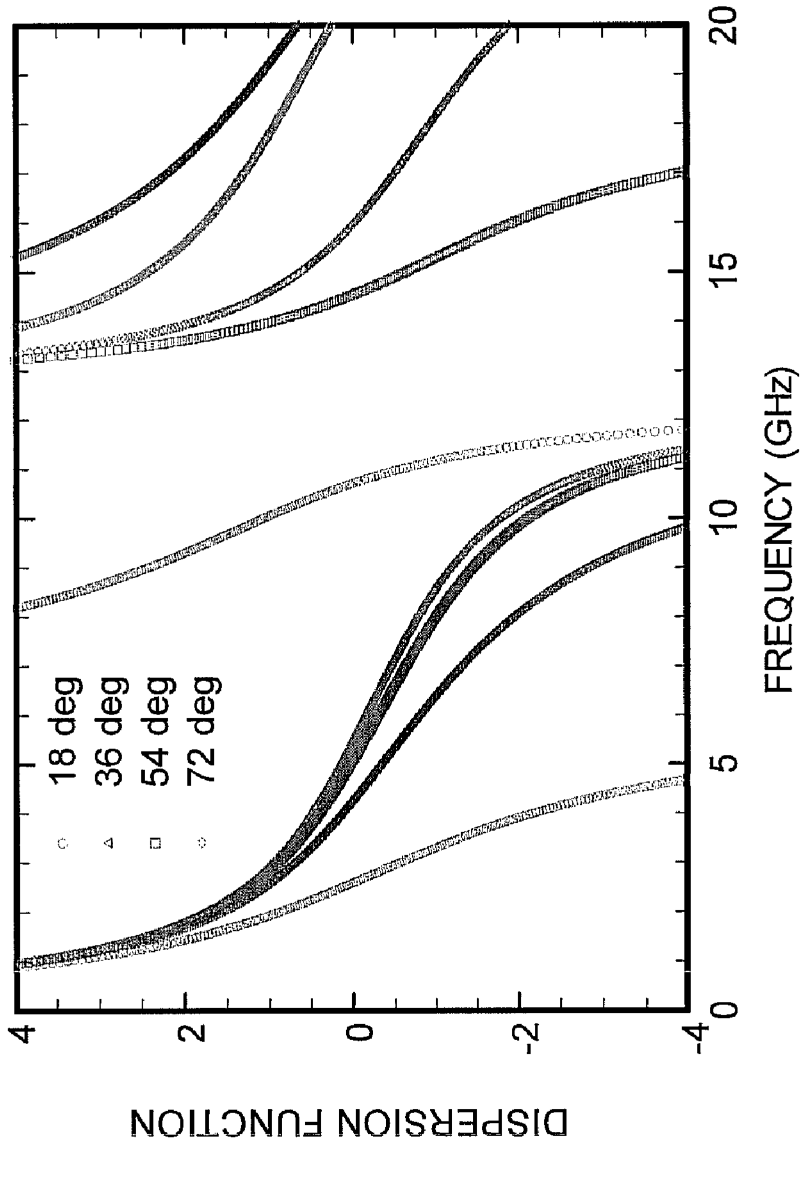
FIGS. 4A-4B show plots of the dispersion functions $D_a(\omega, k)$ for the anti-symmetric modes as they vary with frequency at several values of phase shifts.
Figure 4B:
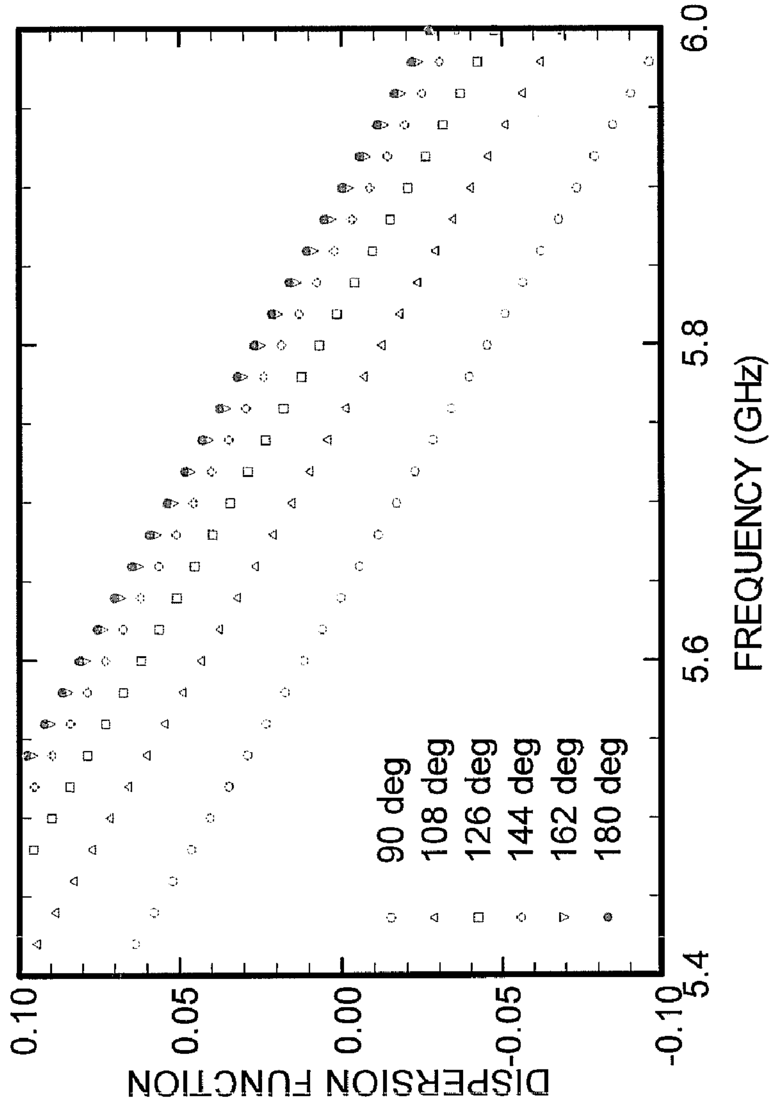

FIGS. 4A-4B show plots of the dispersion functions $D_a(\omega, k)$ for the anti-symmetric modes as they vary with frequency at several values of phase shifts (or wave numbers). The phase shift is equal to 360°×($k_z L/2\pi$). For a given phase shift, the zeros of the dispersion function correspond to the eigenfrequencies of the system. In this example, there is one zero below 20 GHz at least, as shown in FIG. 4A.

Figure 5A:
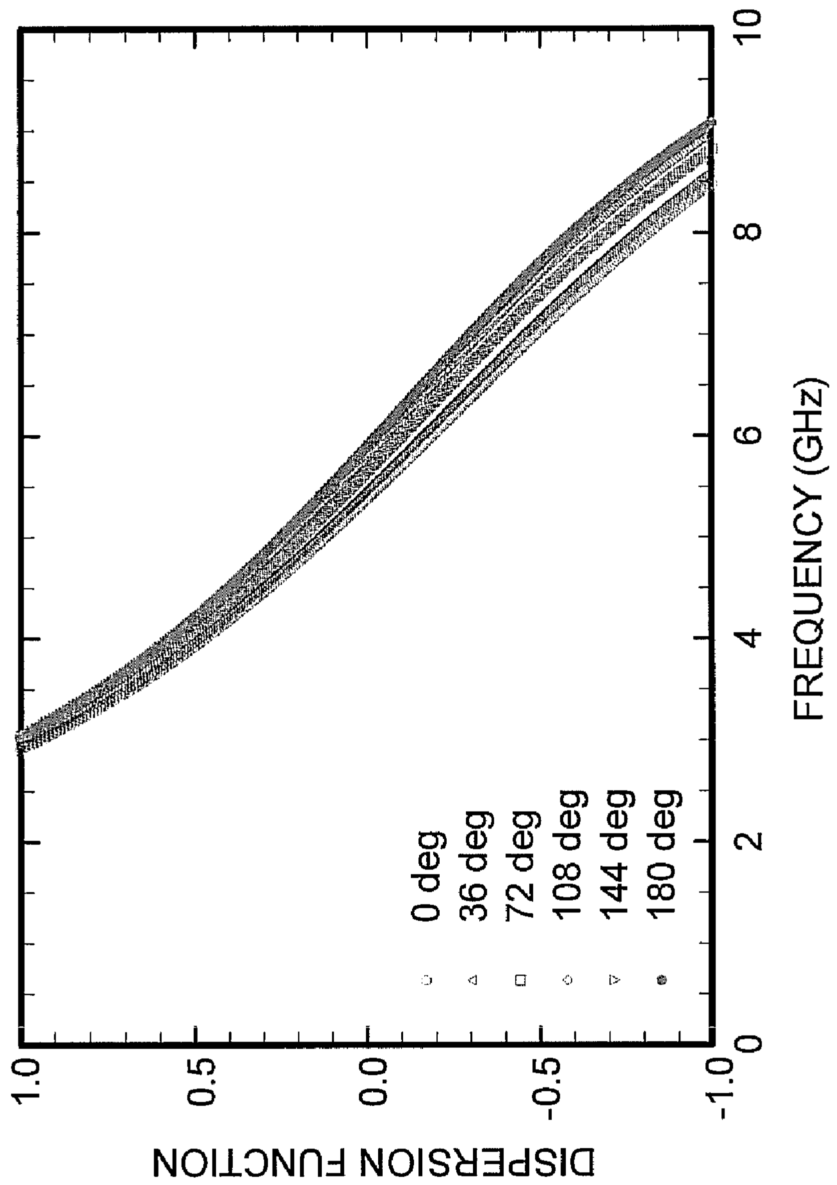
FIGS. 5A-5B show plots of the dispersion functions $D_S(\omega, k)$ for the symmetric modes as they vary with frequency at several values of phase shifts.
Figure 5B:
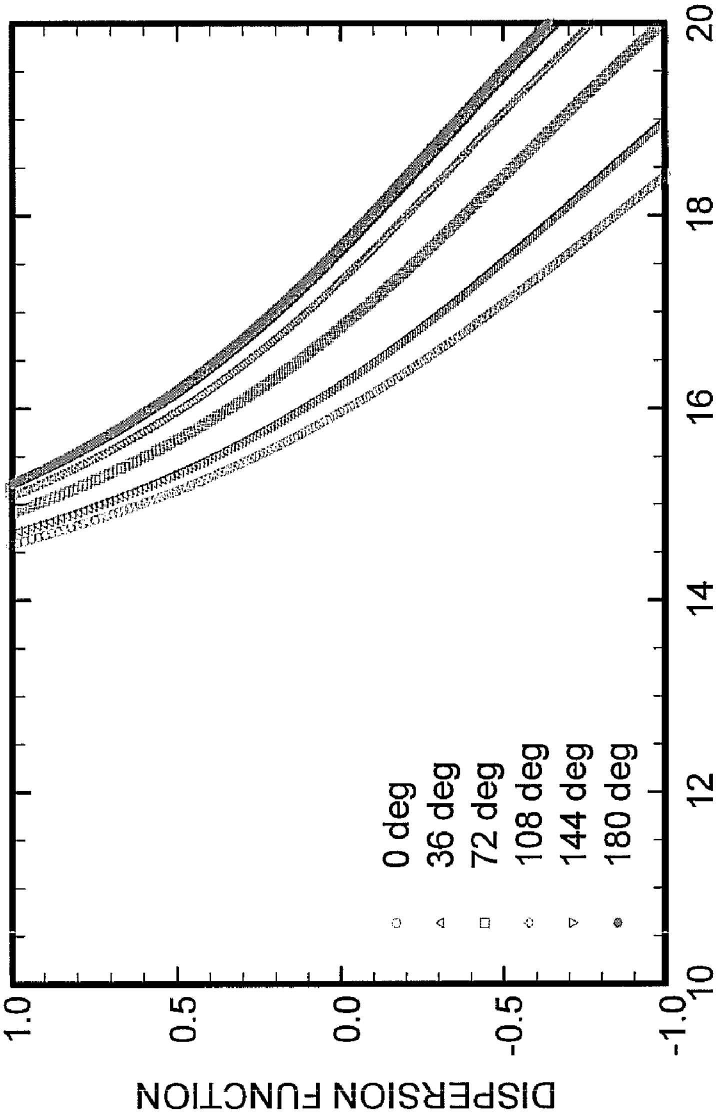

FIGS. 5A-5B show plots of the dispersion functions $D_s(\omega, k)$ for the symmetric modes as they vary with frequency at several values of phase shifts (or wave numbers). The phase shift is equal to 360°×($k_z L/2\pi$). For a given phase shift, the zeros of the dispersion function correspond to the eigenfrequencies of the system. In this example, there is one zero below 20 GHz at least, as shown in FIG. 5A.

Figure 6:
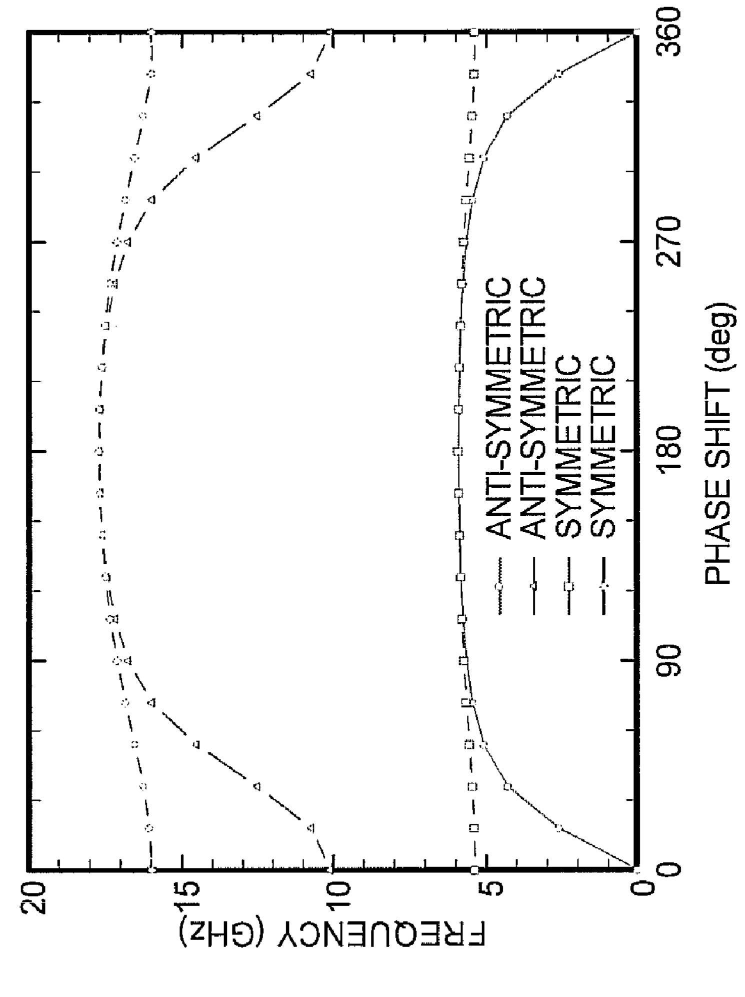
FIG. 6 is a graph illustrating eigenfrequencies for the two lowest bands of anti-symmetric modes and the two lowest bands of symmetric modes.

The eigenfrequencies for the two lowest bands of anti-symmetric modes and the two lowest bands of symmetric modes are plotted as a function of phase shift in FIG. 6.

In the double-sided slow-wave structure, both anti-symmetric and symmetric modes exist. In the phase shift range from 90° to 270°, the anti-symmetric and symmetric modes are nearly degenerate in the first band as well as in the second band, as shown in FIG. 6. In the single-side slow-wave structure, however, only the anti-symmetric modes shown in FIG. 6 exist, and they are well separated in frequency. This sharp contrast in the mode properties makes the single-sided slow-wave structure a better choice for use in the PCRB TWA, because there are no symmetric modes.

Figure 7:
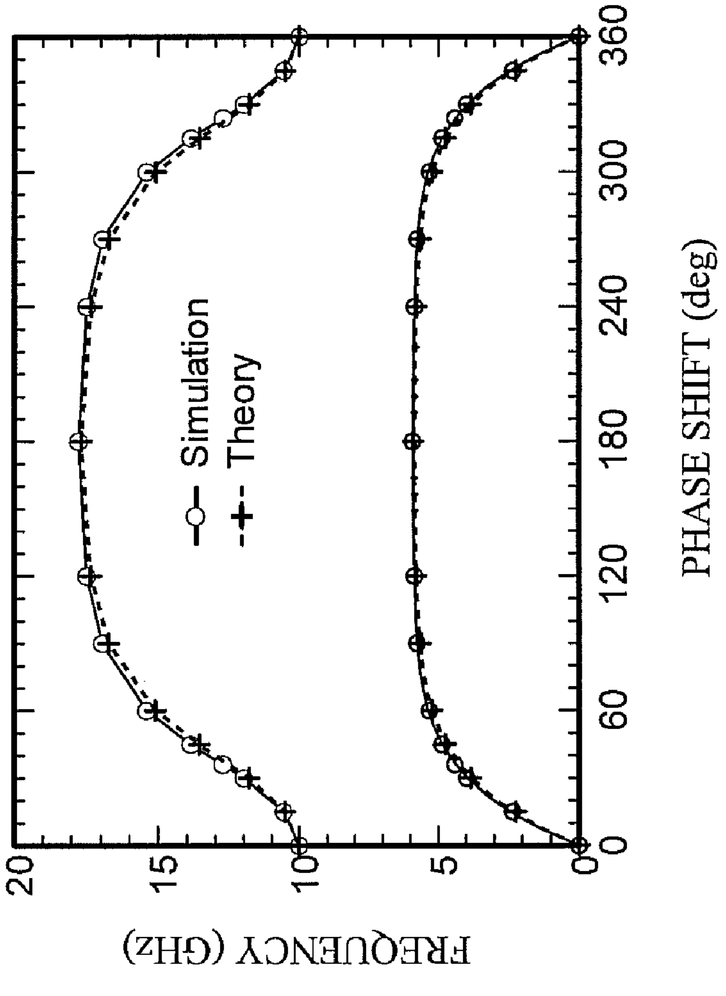
FIG. 7 is a graph illustrating the comparison between the eigenfrequencies for the two lowest anti-symmetric modes with the same system parameters as in FIG. 6.

The eigenfrequencies of the TWA can also be determined using SUPERFISH code. FIG. 7 shows the comparison between the eigenfrequencies calculated with SUPERFISH and Eq. 27 for the two lowest anti-symmetric modes with the same system parameters as in FIG. 6 or in Eq. 31. Only two lowest modes are plotted in FIG. 7. As can be seen from FIG. 7, the theoretical results and SUPERFISH simulations are in excellent agreement. Therefore, the theory derived for PCRB TWA is applicable for designing an actual device.

The ribbon beam, as shown in FIGS. 1A, is an important component for the efficient operation of the invention. Note the ribbon beam uses a planar wiggler magnetic field.

Let us first consider a ribbon beam in the planar wiggler field $$B_w(x) = -B_w[\hat{e}_x \cosh(k_w x)\cos(k_w z) - \hat{e}_z \sinh(k_w x)\sin(k_w z)], \quad \text{Eq. 32}$$

where $B_w$=constant, $k_w=2\pi/\lambda_w$, and $\lambda_w$ is the wiggler period. Introducing the vector potential $$A_w(x) = \frac{m_e c^2 a_w}{e}\cosh(k_w x)\sin(k_w z)\hat{e}_y \quad \text{Eq. 33}$$

with the gauge condition $$B_w(x) = \nabla \times A_w(x), \quad \text{Eq. 34}$$

the Hamiltonian for the single-particle motion in cgs units, $$H(x, z, P_x, P_y, P_z) = \frac{1}{2m_e}\left[P_x^2 + \left(P_y + \frac{e}{c}A_w\right)^2 + P_z^2\right], \quad \text{Eq. 35}$$

can be expanded for $P_y = mv_y - (e/c)A_w(x,z) = 0$ and $|k_w x| < 1$ as $$H(x,z,P_x,P_y,P_z) \cong H_0(P_z) + H_\beta(x,P_x). \quad \text{Eq. 36}$$

In Eq. 36, the Hamiltonians $$H_0(P_z) = \frac{P_z^2}{2m_e} + \frac{1}{4}a_w^2 m_e c^2 \quad \text{Eq. 37}$$

and $$H_\beta(x, P_x) = \frac{1}{2m_e}(P_x^2 + m_e^2\omega_\beta^2 x^2) \quad \text{Eq. 38}$$

describe the axial motion and the (transverse) betatron oscillations, respectively, and $$\omega_\beta = \frac{1}{\sqrt{2}}ck_w a_w = \frac{1}{\sqrt{2}}\left(\frac{eB_w}{m_e c}\right) \quad \text{Eq. 39}$$

is the betatron oscillation frequency.

For $P_y=0$ and $|k_w x|<1$, the equations of motion are $$\frac{dz}{dt}=\frac{P_z}{m_e}, \quad \text{Eq. 40}$$

$$\frac{dx}{dt}=\frac{P_x}{m_e}, \quad \text{Eq. 41}$$

$$\frac{dP_z}{dt}=0, \quad \text{Eq. 42}$$

$$\frac{dP_x}{dt}=-m_e\omega_\beta^2 x. \quad \text{Eq. 43}$$

Since $$v_z=\beta_b c=\text{constant}, \quad \text{Eq. 44}$$

the equation of motion for the betatron oscillations can be expressed alternatively as $$\frac{d^2x}{dz^2}+k_\beta^2 x=0, \quad \text{Eq. 45}$$

where $$k_\beta=\frac{\omega_\beta}{\beta_b c} \quad \text{Eq. 46}$$

is the betatron wavenumber.

For simplicity, the coupling between the beam envelopes in the x- and y-directions is ignored, and express the beam envelope equation in the x-direction as $$\frac{d^2x_b}{dz^2}+k_\beta^2 x_b-\frac{K}{2(x_b+y_b)}-\frac{\varepsilon_x^2}{x_b^3}=0, \quad \text{Eq. 47}$$

where $$x_b^2=\langle x^2\rangle, \quad \text{Eq. 48}$$

$$y_b^2=\langle y^2\rangle, \quad \text{Eq. 49}$$

$$K=\frac{2I_b}{I_A\beta_b^2}, \quad \text{Eq. 50}$$

$$\frac{I_A}{\beta_b}=\frac{m_e c^3}{e}\cong 17\ kA, \quad \text{Eq. 51}$$

$$\varepsilon_x^2=\langle x^2\rangle\left\langle\left(\frac{dx}{dz}\right)^2\right\rangle-\left\langle x\frac{dx}{dz}\right\rangle^2=\frac{x_b^2}{\beta_b^2c^2}\left(\frac{k_BT}{m_e}\right). \quad \text{Eq. 52}$$

Here, $k_B$ is the Boltzmann constant, T is the Kelvin temperature, and <X> denotes $$\langle \chi\rangle=\frac{\int xf\,dxdydx'dy'}{\int f dxdydx'dy'} \quad \text{Eq. 53}$$

with $x'=dx/dz$, $y'=dy/dz$, and $f(x,y,x',y')$ is the electron distribution function.

In the zero-current limit, K=0 and it follows from Eq. 47 that the equilibrium rms beam envelope is given by $$x_b=\left(\frac{k_BT}{m_e}\right)^{1/2}\frac{1}{k_\beta\beta_b c}, \quad \text{Eq. 54}$$

or the wiggler field required for the beam equilibrium amplitude to occur is given by $$\frac{eB_w}{m_e c}=\left(\frac{2k_BT}{m_e}\right)^{1/2}\frac{1}{x_b}, \quad \text{Eq. 55}$$

which allows us to calculate $B_w$. Note that the wiggler period $\lambda_w$ does not appear in Eq. 55. However, one must demand $$2k_w x_b\leqq 1, \quad \text{Eq. 56}$$

or $$\lambda_w\geqq 4\pi x_b \quad \text{Eq. 57}$$

for the approximations in Eq. 51 to be valid.

For example, taking $$x_b=0.06\text{ cm}, \quad \beta_b=0.08, \quad \frac{1}{2}m_e\beta_b^2c^2=1700\ eV, \quad \frac{1}{2}k_BT=\frac{1}{40}\times\frac{1200}{300}=0.1\ eV, \quad \text{Eq. 58}$$

one can obtain from Eq. 55, $$B_w=24.7\text{ G}, \quad \text{Eq. 59}$$

which is easily achievable.

For a finite beam current, $K\neq 0$ and it follows from Eq. 47 that the rms beam envelope is given by $$x_b=\frac{1}{k_\beta}\left[\frac{K}{2(\xi+1)}+\frac{k_BT}{m_e\beta_b^2c^2}\right]^{1/2}, \quad \text{Eq. 60}$$

or $$\frac{eB_w}{m_e c}=\frac{\beta_b c}{x_b}\left[\frac{K}{(\xi+1)}+\frac{2k_BT}{m_e\beta_b^2c^2}\right]^{1/2}, \quad \text{Eq. 61}$$

where $$\xi=\frac{y_b}{x_b} \quad \text{Eq. 62}$$

is the aspect ratio of the ribbon beam. In this discussion, the value of $\xi$ is fixed.

For example, taking $$x_b=0.06\text{ cm}, \quad \beta_b=0.08, \quad \frac{1}{2}m_e\beta_b^2c^2=1700\text{ eV}, \quad \text{Eq. 63}$$

-continued $$\frac{1}{2}k_BT = \frac{1}{40}\times\frac{1200}{300} = 0.1\text{ eV},$$

$$I_b = 0.076\text{ A},$$

$$\xi = 10,$$

one obtains from Eq. 63, $$B_w = 93.9\text{ G}, \qquad \text{Eq.64}$$

which is still easily achievable.

Figure 8:
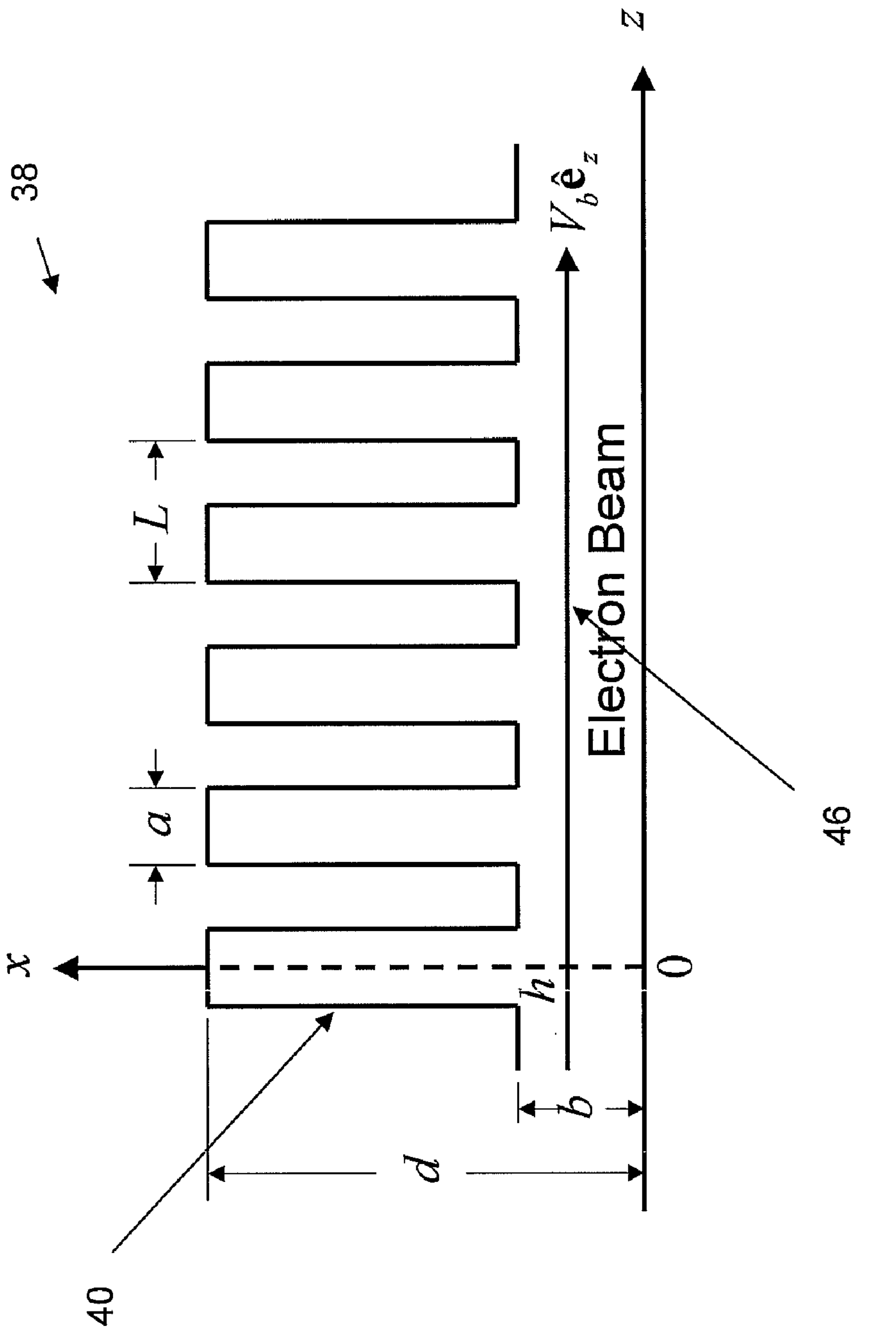
FIG. 8 is a schematic diagram illustrating a ribbon electron beam interacting with a single-sided PC slow-wave structure.

Now, a ribbon electron beam 46 interacts with a single-sided PC slow-wave structure 48, similar to structure 38 of FIG. 2, shown in FIG. 8. The equilibrium of the beam 46 is described by $$V = V_b\hat{e}_z = \beta_b c\hat{e}_z, \qquad \text{Eq. 65}$$

$$J = -e\sigma_b V_b \delta(x-h)\hat{e}_z = -\frac{dI_b}{dy}\delta(x-h)\hat{e}_z, \qquad \text{Eq. 66}$$

where $V_b$=constant is the equilibrium beam velocity, $\sigma_b$ is the surface number density of the electrons in the ribbon beam, the sheet x=h specifies the transverse displacement of the beam, and $$I_b = \int_{y=-2y_b}^{2y_b}\int_{x=0}^{b}\frac{dI_b}{dy}\delta(x-h)\,dx\,dy \qquad \text{Eq. 67}$$

is the beam current, and $y_b$ is the rms width of the ribbon beam.

In this analysis, the variations are ignored in the y-direction, and treat the stability of the ribbon beam 46 as a two-dimensional problem. The linearized cold-fluid equations are $$\left(\frac{\partial}{\partial t} + V_b\frac{\partial}{\partial z}\right)\delta V_z = -\frac{e}{m}\delta E_z\Big|_{x=h}, \qquad \text{Eq. 68}$$

$$\left(\frac{\partial}{\partial t} + V_b\frac{\partial}{\partial z}\right)\delta\sigma + \sigma_b\frac{\partial}{\partial z}\delta V_z = 0, \qquad \text{Eq. 69}$$

$$\begin{aligned}\left(\frac{\partial^2}{\partial x^2} + \frac{\partial^2}{\partial z^2} - \frac{1}{c^2}\frac{\partial^2}{\partial t^2}\right)\delta E_z &= \frac{4\pi}{c^2}\frac{\partial\delta J_z}{\partial t} + 4\pi\frac{\partial\delta\rho}{\partial z} \\ &= -4\pi e\left\{\frac{1}{c^2}\frac{\partial}{\partial t}(V_b\delta\sigma + \sigma_b\delta V_z) + \frac{\partial}{\partial z}\delta\sigma\right\}\delta(x-h),\end{aligned} \qquad \text{Eq. 70}$$

where the charge and current density perturbations $\delta\rho(x,z,t)$ and $\delta J_z(x,z,t)$ are defined as $$\delta\rho(x,z,t) = -e\delta\sigma(z,t)\delta(x-h), \qquad \text{Eq. 71}$$

$$\delta J_z(x,z,t) = -e\delta\sigma(z,t)\delta(x-h)V_b - e\sigma_b\delta(x-h)\delta V_z(z,t). \qquad \text{Eq. 72}$$

Expressing all perturbations as $$\delta\psi(x,z,t) = e^{i(k_z z-\omega t)}\sum_{n=-\infty}^{\infty}\delta\psi_n(x)e^{i2\pi nz/L}, \qquad \text{Eq. 73}$$

or $$\delta V_z(z,t) = e^{i(k_z z-\omega t)}\sum_{n=-\infty}^{\infty}\delta V_{2n}e^{i2\pi nz/L}, \qquad \text{Eq. 74}$$

$$\delta\sigma(z,t) = e^{i(k,z-\omega t)}\sum_{n=-\infty}^{\infty}\delta\sigma_n e^{i2\pi nz/L}, \qquad \text{Eq. 75}$$

$$\delta E_z(x,z,t) = e^{i(k,z-\omega t)}\sum_{n=-\infty}^{\infty}\delta E_{2n}(x)e^{i2\pi nz/L}, \qquad \text{Eq. 76}$$

one can rewrite the linearized cold-fluid equations 69-70 as $$i(\omega - k_nV_b)\,\delta V_{zn} = \frac{e}{m}\delta E_{sn}(h), \qquad \text{Eq. 77}$$

$$(\omega - k_nV_b)\delta\sigma_n - k_n\sigma_b\delta V_{zn} = 0, \qquad \text{Eq. 78}$$

$$\left(\frac{d^2}{dx^2} + p_n^2\right)\delta E_{zn}(x) = 4\pi ie\left(\frac{\omega V_b}{c^2}\delta\sigma_n + \frac{\omega\sigma_b}{c^2}\delta V_{zn} - k_n\delta\sigma_n\right)\delta(x-h), \qquad \text{Eq. 79}$$

where $k_n$ and $p_n^2$ are defined as $$k_n = k_z + \frac{2\pi n}{L}, \qquad \text{Eq. 80}$$

$$p_n^2 = \frac{\omega^2}{c^2} - k_n^2. \qquad \text{Eq. 81}$$

Solving for $\delta V_{zn}$ and $\delta\sigma_n$ from Eqs. 67 and 68 in terms of $\delta E_{zn}(h)$ yields $$\delta V_{zn} = -\frac{ie}{m}\frac{\delta E_{zn}(h)}{(\omega - k_nV_b)}, \qquad \text{Eq. 82}$$

$$\delta\sigma_n = -\frac{ie}{m}\frac{k_n\sigma_b\delta E_{2n}(h)}{(\omega - k_nV_b)^2}. \qquad \text{Eq. 83}$$

Substituting Eqs. 82 and 83 into Eq. 79, one obtains $$\left(\frac{d^2}{dx^2} + p_n^2\right)\delta E_{zn}(x) = \frac{4\pi e^2\sigma_b}{m}\frac{p_n^2\delta E_{zn}(h)}{(\omega - k_nV_b)^2}\delta(x-h). \qquad \text{Eq. 84}$$

The solutions to Eq. 84 are $$\delta E_{zn}(x) = \begin{cases} A_n^{<}\sin(p_nx) + B_n^{<}\cos(p_nx), & 0 < x < h, \\ A_n^{>}\sin(p_nx) + B_n^{>}\cos(p_nx), & h < x < b, \end{cases} \qquad \text{Eq. 85}$$

where $A_n^{<}$, $B_n^{<}$, $A_n^{>}$ and $B_n^{>}$ are constants to be determined by the boundary conditions at x=0, x=h, and x=b.

The coefficients $A_n^<$, $B_n^<$, $A_n^>$ and $B_n^>$ are determined in the following three steps. First, note the electric field $\delta E_z(x, z,t)$ vanishes at x=0. This requires $$\delta E_{zn}(0)=0. \qquad \text{Eq. 86}$$

Therefore, one must have $$B_n^<=0. \qquad \text{Eq. 87}$$

Second, the coefficients $A_n^>$ and $B_n^>$ are expressed in terms of $A_n^<$, using both the continuity of the axial electric field at x=h, for example, $$A_n^>\sin(p_nh)+B_n^>\cos(p_nh)-A_n^<\sin(p_nh)=0, \qquad \text{Eq. 88}$$

and the relation $$\left.\frac{d\delta E_{zn}}{dx}\right|_{x=h-0}^{h+0} = \frac{4\pi e^2\sigma_b}{m}\frac{p_n^2}{(\omega-k_nV_b)^2}A_n^<\sin(p_nh) \qquad \text{Eq. 89}$$

or $$A_n^>\cos(p_nh) - B_n^>\sin(p_nh) - A_n^<\cos(p_nh) = \frac{4\pi e^2\sigma_b}{m}\frac{p_n}{(\omega-k_nV_b)^2}A_n^<\sin(p_nh). \qquad \text{Eq. 90}$$

Solving Eqs. 88 and 90 for $A_n^>$ and $B_n^>$ gives $$\frac{A_n^>}{A_n^<} = 1+\alpha_n(\omega, k)\cos(p_nh), \qquad \text{Eq. 91}$$

$$\frac{B_n^>}{A_n^<} = -\alpha_n(\omega, k)\sin(p_nh), \qquad \text{Eq. 92}$$

where the function $\alpha_n(\omega,k)$ is defined by $$\alpha_n(\omega, k) = \frac{4\pi e^2\sigma_b}{m_e}\frac{p_n\sin(p_nh)}{(\omega-k_nV_b)^2}. \qquad \text{Eq. 93}$$

Furthermore, the electric and magnetic fields are expressed in the region h<x<b as $$\delta E_z(x, z, t) = \sum_{n=-\infty}^{\infty}[A_n^>\sin(p_nx) + B_n^>\cos(p_nx)]e^{i(k_nz-\omega t)}, \qquad \text{Eq. 94}$$

$$\delta E_x(x, z, t) = \frac{c}{i\omega}\frac{\partial}{\partial z}\delta B_y(x, z, t), \qquad \text{Eq. 95}$$

$$\delta B_y(x, z, t) = \frac{i\omega}{cp_n}\sum_{n=-\infty}^{\infty}[A_n^>\cos(p_nx) - B_n^>\cos(p_nx)]e^{i(k_nz-\omega t)}. \qquad \text{Eq. 96}$$

Third, a relationship is derived between the coefficient $A_n^<$ and the electric field amplitude $E_0$ in the corrugated-vane region, using the approximations in Eqs. 11-13, $$B_y(x, z, t) \cong iE_0e^{i(k_zsL-\omega t)}\cos\left[\frac{\omega}{c}(x-d)\right], \qquad \text{Eq. 97}$$

$$E_x(x,z,t)\cong 0, \qquad \text{Eq. 98}$$

$$E_z(x, z, t) \cong E_0e^{i(k_zsL-\omega t)}\sin\left[\frac{\omega}{c}(x-d)\right] \qquad \text{Eq. 99}$$

for |z−sL|<a/2 and b<x<d. Here, s=0, ±1, ±2, . . . This gives $$\left[\frac{A_n^>}{A_n^<}\sin(p_nb)+\frac{B_n^>}{A_n^<}\cos(p_nb)\right]A_n^< = \frac{aE_0}{L}\sin\left[\frac{\omega}{c}(b-d)\right]\frac{\sin\left[\left(k_z+\frac{2\pi n}{L}\right)\frac{a}{2}\right]}{\left(k_z+\frac{2\pi n}{L}\right)\frac{a}{2}}, \qquad \text{Eq. 100}$$

which relates $A_n^<$ and $E_0$.

Using the expressions for the electric and magnetic fields in Eqs. 94-99, the continuity of the axial electric field at x=b, and Eq. 100, it is readily shown that the loaded admittances $A_L^\pm(\omega,k_z)$, defined in the same manner as the unloaded admittances $A^\pm(\omega,k_z)$ in Eq. 23, are given by $$A_L^+(\omega, k_z) = A^+(\omega, k_z) = \frac{1}{ia}\cot\left[\frac{\omega}{c}(d-b)\right]\cdot\frac{\left(\frac{k_za}{2}\right)^2}{\sin^2\left(\frac{k_za}{2}\right)} \qquad \text{Eq. 101}$$

and $$A_L^-(\omega, k_z) = \left(\frac{i\omega b}{cL}\right)\left|\frac{\frac{k_za}{2}}{\sin\left(\frac{k_za}{2}\right)}\right|^2\times\sum_{n=-\infty}^{\infty}\left(\frac{1}{p_nb}\right)\frac{\frac{A_n^>}{A_n^<}\cos(p_nb)-\frac{B_n^>}{A_n^<}\sin(p_nb)}{\frac{A_n^>}{A_n^<}\sin(p_nb)+\frac{B_n^>}{A_n^<}\cos(p_nb)}\left|\frac{\sin\left[\left(k_z+\frac{2\pi n}{L}\right)\frac{a}{2}\right]}{\left(k_z+\frac{2\pi n}{L}\right)\frac{a}{2}}\right|^2. \qquad \text{Eq. 102}$$

Setting $$A_L^+(\omega,k_z)=A_L^-(\omega,k_z), \quad \text{Eq. 103}$$

one obtains the loaded dispersion relation $$D_a^L(\omega,k_z) \equiv \cot\left[\frac{\omega}{c}(d-b)\right] + \frac{\omega ab}{cL} \sum_{n=-\infty}^{\infty} \left(\frac{1}{p_n b}\right) \frac{\cos(p_n b)+\alpha_n\cos[p_n(b-h)]}{\sin(p_n b)+\alpha_n\sin[p_n(b-h)]} \left|\frac{\sin\left(k_n\frac{a}{2}\right)}{k_n\frac{a}{2}}\right|^2 = 0 \quad \text{Eq. 104}$$

where use has been made of Eqs. 91-93, and the functions $k_n=k_n(k_z)$, $p_n=p_n(\omega,k_z)$ and $\alpha_n=\alpha_n(\omega,k_z)$ are defined in Eqs. 80, 81 and 93, respectively.

When $I_b=0$ (or $\alpha_n=0$), the dispersion relation (Eq. 104) reduces to the vacuum dispersion relation (Eq. 91) as expected.

In the Compton regime, $|\alpha_n|<<1$ and one may make the approximation $$\begin{aligned}\frac{\cos(p_n b)+\alpha_n\cos[p_n(b-h)]}{\sin(p_n b)+\alpha_n\sin[p_n(b-h)]} &\cong \cot(p_n b) + \alpha_n\frac{\sin(p_n h)}{\sin^2(p_n b)} \\ &= \cot(p_n b) + \frac{4\pi e^2\sigma_b}{m_e}\frac{p_n}{(\omega-k_nV_b)^2}\frac{\sin^2(p_n h)}{\sin^2(p_n b)}\end{aligned} \quad \text{Eq. 105}$$

and express the loaded dispersion relation approximately as $$D_a(\omega,k_z) = \frac{\omega a}{cL}\left(\frac{4\pi e^2\sigma_b}{m_e}\right)\sum_{n=-\infty}^{\infty}\frac{1}{(\omega-k_nV_b)^2}\frac{\sin^2(p_n h)}{\sin^2(p_n b)}\left|\frac{\sin\left(k_n\frac{a}{2}\right)}{k_n\frac{a}{2}}\right|^2, \quad \text{Eq. 106}$$

where $D_a(\omega,k_z)$ is the vacuum dispersion function defined in Eq. (3.1.27). Furthermore, if only one term on the right-hand side of Eq. (5.2.2) dominates, say n=m, then one can further approximate the loaded dispersion relation as $$D_a(\omega,k_z)(\omega-k_mV_b)^2=\tilde{\epsilon}_m(\omega,k_z), \quad \text{Eq. 107}$$

where the coupling parameter $\tilde{\epsilon}_m(\omega,k_z)$ is defined by $$\tilde{\varepsilon}_m(\omega,k_z) = \frac{\omega a}{cL}\left(\frac{4\pi e^2\sigma_b}{m_e}\right)\frac{\sin^2(p_m h)}{\sin^2(p_m b)}\left|\frac{\sin\left[k_m\frac{a}{2}\right]}{k_m\frac{a}{2}}\right|^2. \quad \text{Eq. 108}$$

To estimate the linear gain and bandwidth in the Compton regime, let $(\omega_c,k_c)$ denote an intersection point of $$D_a(\omega,k_z)=0 \quad \text{Eq. 109}$$

and $$\omega-(k_z+2\pi m/L)V_b=0 \quad \text{Eq. 110}$$

in the ω versus $k_z$ diagram. Expanding $D_a(\omega,k_z)$ about the point $(\omega,k_z)=(\omega_c,k_c)$, i.e., $$\begin{aligned}D_a(\omega,k_z) &\cong \left(\frac{\partial D_a}{\partial\omega}\right)_{(\omega_c,k_c)}(\omega-\omega_c) + \left(\frac{\partial D_a}{\partial k_z}\right)_{(\omega_c,k_c)}(k_z-k_c) \\ &= \left(\frac{\partial D_a}{\partial\omega}\right)_{(\omega_c,k_c)}[\omega-\omega_c-v_g(k_z-k_c)]\end{aligned} \quad \text{Eq. 111}$$

with $v_g$ being the group velocity, and introducing the rescaled coupling parameter $$\varepsilon_m = \left(\frac{\partial D_a}{\partial\omega}\right)^{-1}_{(\omega_c,k_c)}\tilde{\varepsilon}_m(\omega_c,k_c), \quad \text{Eq. 112}$$

one can express the loaded dispersion relation in the following simplified form $$[\omega-\omega_c-v_g(k_z-k_c)][\omega-k_zV_b-(2\pi m/L)V_b]^2=\epsilon_m. \quad \text{Eq. 113}$$

Because Eq. 113 is cubic in either ω or $k_z$, it can be solved analytically.

The frequency shift δω and the detuning parameter $\Delta\Omega_m$ is defined as $$\delta\omega=\omega-k_zV_b-(2\pi m/L)V_b, \quad \text{Eq. 114}$$

$$\Delta\Omega_m=\omega_c+v_g(k_z-k_c)-k_zV_b-(2\pi m/L)V_b. \quad \text{Eq. 115}$$

The loaded dispersion relation becomes $$(\delta\omega)^2(\delta\omega-\Delta\Omega_m)=\epsilon_m. \quad \text{Eq. 116}$$

Since $\tilde{\epsilon}_m>0$ and $(\partial D_a/\partial\omega)<0$ (see FIG. 3), where $\epsilon_m<0$. Consequently, Eq. 116 yields the maximum temporal growth rate $$|\mathrm{Im}\,\delta\omega|_{\max} = \frac{\sqrt{3}}{2}|\varepsilon_m|^{\frac{1}{3}} \quad \text{Eq. 117}$$

at $\Delta\Omega_m=0$. Since $\epsilon_m \propto I_b$, the scaling relation $$|\mathrm{Im}\,\delta\omega|_{max}\propto I_b^{1/3} \quad \text{Eq. 118}$$

holds in the Compton regime.

In the Raman regime, one must treat the space-charge term in Eq. 104 carefully. In this case, the Eq. 104 is expressed as $$D_a(\omega,k_z) = \frac{\omega ab}{cL}\sum_{n=-\infty}^{\infty}\left(\frac{1}{p_n b}\right)\left\{\frac{\cos(p_n b)+\alpha_n\cos[p_n(b-h)]}{\sin(p_n b)+\alpha_n\sin[p_n(b-h)]} - \cot(p_n b)\right\}\left|\frac{\sin\left[k_n\frac{a}{2}\right]}{k_n\frac{a}{2}}\right|^2 \quad \text{Eq. 119}$$

where $D_a(\omega,k_z)$ is the vacuum dispersion function defined in Eq. 27. Substituting Eq. 93 into Eq. 119, and assuming that only one term on the right-hand side of Eq. 106 dominates, say n=m, $$D_a(\omega,k_z)[(\omega-k_mV_b)^2-(QC)_m^2(\omega,k_z)]=\tilde{\epsilon}_m(\omega,k_z), \quad \text{Eq. 120}$$

where the coupling parameter $\tilde{\epsilon}_m(\omega,k_z)$ is defined in Eq. 108, and the space-charge parameter $(QC)_m^2$ is defined by $$(QC)_m^2(\omega, k_z) = -\left(\frac{4\pi e^2\sigma_b}{m_e}\right)\frac{p_m\sin(p_m h)\sin[p_m(b-h)]}{\sin^2(p_m b)}. \quad \text{Eq. 121}$$

Typically, the space-charge parameter $(QC)_m^2(\omega,k_z)$ is positive in the regime of interest.

To estimate the linear gain and bandwidth in the Raman regime, let $(\omega_c,k_c)$ denote an intersection point of $$D_a(\omega,k_z)=0 \quad \text{Eq. 122}$$

and $$\omega-(k_z+2\pi m/L)V_b-(QC)_m(\omega,k_z)=0 \quad \text{Eq. 123}$$

in the ω versus $k_z$ diagram. Making use of the expansion in Eq. 111, one can express the loaded dispersion relation in the following simplified form $$[\omega-\omega_c-v_g(k_2-k_c)][\omega-k_zV_b-(2\pi m/L)V_b-(QC)_m(\omega_c,k_c)] = \frac{\varepsilon_m}{2(QC)_m(\omega_c,k_c)}, \quad \text{Eq. 124}$$

where $\epsilon_m$ is defined in Eq. 112.

Following an earlier analysis, the frequency shift δω and the detuning parameter $\Delta\Omega_m$ is defined as $$\delta\omega=\omega-k_zV_b-(2\pi m/L)V_b-(QC)_m(\omega_c,k_c), \quad \text{Eq. 125}$$

$$\Delta\Omega_m=\omega_c+v_g(k_z-k_c)-k_zV_b-(2\pi m/L)V_b-(QC)_m(\omega_c,k_c. \quad \text{Eq. 126}$$

The loaded dispersion relation becomes $$\delta\omega(\delta\omega-\Delta\Omega_m) = \frac{\varepsilon_m}{2(QC)_m(\omega_c,k_c)}. \quad \text{Eq. 127}$$

If $\epsilon_m/(QC)_m(\omega_c,k_c)<0$ the system is unstable, and the maximum temporal growth rate is given by $$|\text{Im}\,\delta\omega|_{\max} = \left|\frac{\varepsilon_m}{2(QC)_m(\omega_c,k_c)}\right|^{1/2} \quad \text{Eq. 128}$$

at $\Delta\Omega_m=0$. Since $\epsilon_m/(QC)_m(\omega_c,k_c)\propto I_b^{1/2}$, the scaling relation $$|\text{Im}\delta\omega|_{max}\propto I_b^{1/4} \quad \text{Eq. 129}$$

holds in the Raman regime.

The dispersion relation in Eq. 104 can be solved numerically using Newton's method to obtain the linear gain. For a real value of the wavenumber $k_z$, the temporal linear growth rate $\omega_i=\text{Im}(\omega)>0$ can be obtained from the complex ω that solves Eq. 104. On the other hand, for a real value of the angular frequency ω, the spatial linear growth rate $k_i=-\text{Im}(k_z)>0$ can be obtained from the complex wavenumber $k_z$ that solves Eq. 104.

Figure 9B:
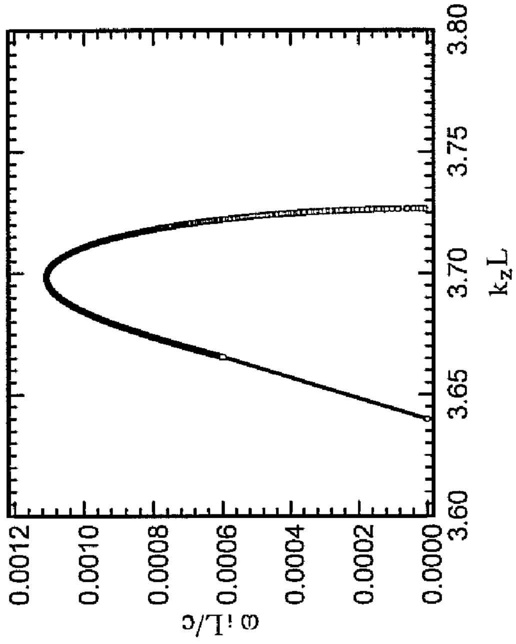
FIGS. 9A-9B are graphs illustrating the temporal linear growth rate of the lowest anti-symmetric mode as a function of the wavenumber.
Figure 9A:
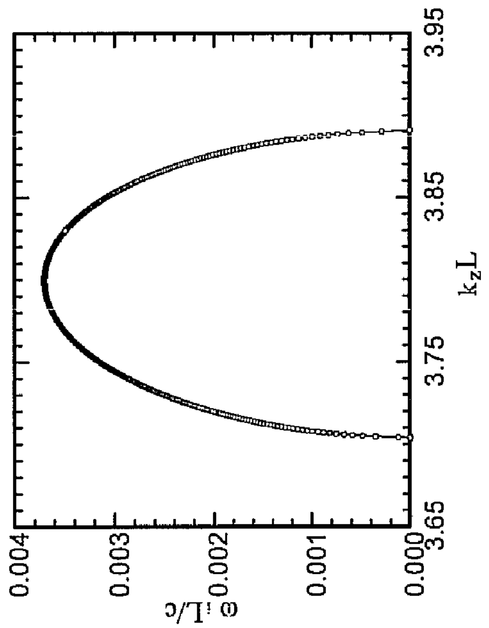

FIGS. 9A-9B show plots of the temporal linear growth rate $\omega_i=\text{Im}(\omega)$ of the lowest anti-symmetric mode as a function of the wavenumber $k_z$ for a/L=0.8, b/L=1.0, d/L=6.0, h/L=0.8, $\beta_b=0.08$ and two cases (a) $\omega_{pb}^2L^2/c^2=7.0\times10^{-5}$ and (b) $\omega_{pb}^2L^2/c^2=7.0\times10^{-7}$, where $\omega_{pb}^2L^2/c^2=4\pi e^2\sigma_bL/c^2m_e=\pi I_bL/\beta_bI_cy_b$ with $I_c=17$ kA. The parameters for the RF circuit in FIGS. 9A-9B are identical to those used in FIGS. 6 and 7. As seen from FIGS. 9A and 9B, each curve has a peak near $\omega\approx k_zV_b$, which represents a stronger beam-wave interaction. For the purpose of illustration, the beam parameters in these examples correspond to backward-wave oscillators not traveling-wave amplifiers. For this RF circuit, a more energetic electron beam is required in order to make an amplifier. The high-current case shown in FIG. 9A indicates a temporal growth rate in the Raman regime (i.e., with an upright bell-shaped curve), whereas the low-current case shown in FIG. 9B implies a temporal growth rate in the Compton regime (i.e., with a tilted bell-shaped curve).

Figure 10A:
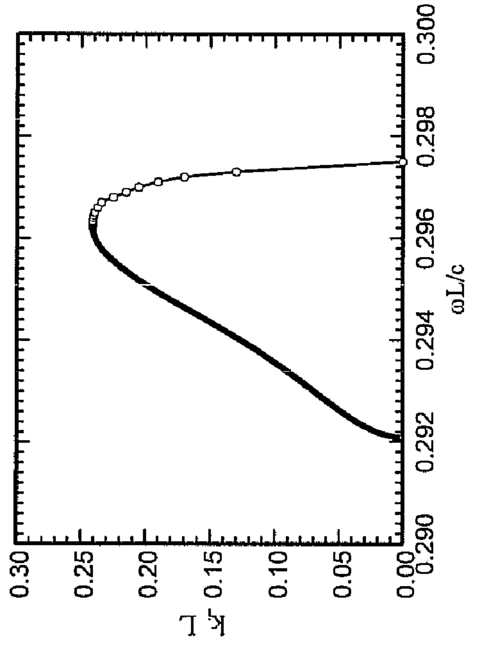
FIGS. 10A-10B are graphs illustrating the spatial linear growth rate of the lowest anti-symmetric mode as a function of angular frequency.
Figure 10B:
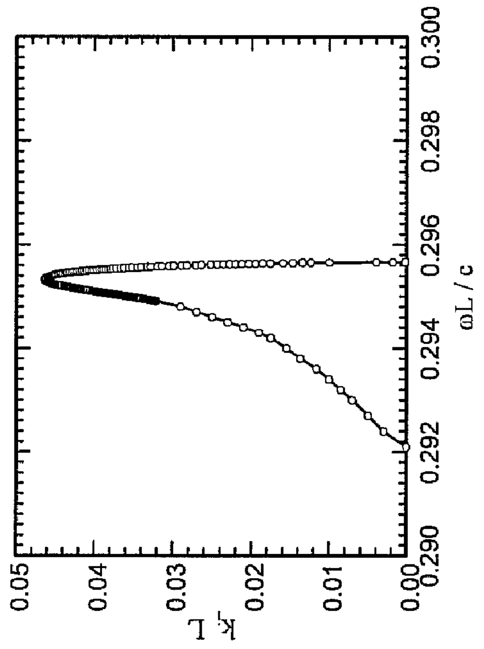

FIGS. 10A-10B show plots of the spatial linear growth rate $k_i=-\text{Im}(k_z)$ of the lowest anti-symmetric mode as a function of angular frequency ω for a/L=0.8, b/L=1.0, d/L=6.0, h/L=0.8, $\beta_b=0.08$. FIG. 9A shows the case $\omega_{pb}^2L^2/c^2=7.0\times10^{-5}$ and FIG. 9B shows the case $\omega_{pb}^2L^2/c^2=7.0\times10^{-7}$. These parameters are identical to those in FIGS. 8A-8B.

Figure 11:
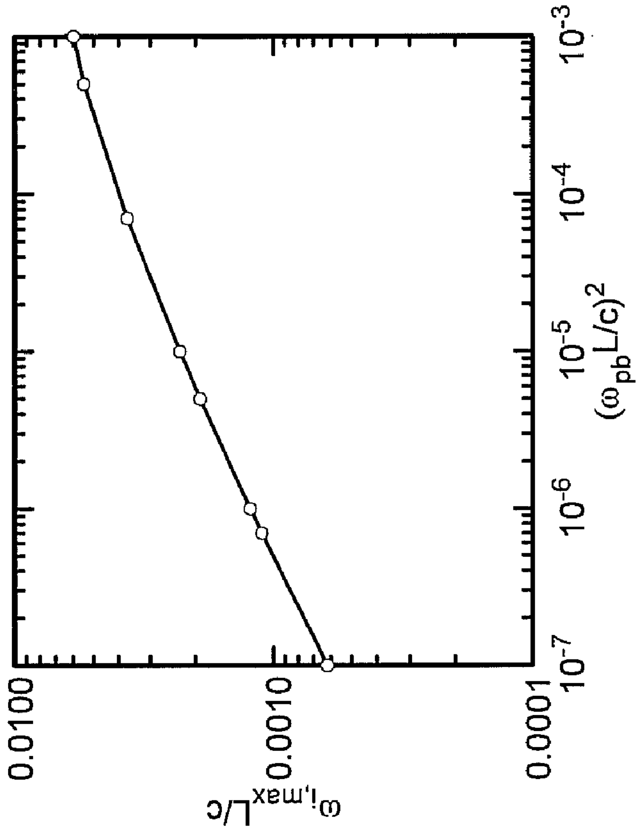
FIG. 11 is a graph demonstrating the maximum temporal growth of the lowest anti-symmetric mode as a function of normalized beam current.

FIG. 11 shows the maximum temporal growth $\omega_{i,max}=[\text{Im}(\omega)]_{max}$ of the lowest anti-symmetric mode as a function of normalized beam current $\omega_{pb}^2L^2/c^2=4\pi e^2\sigma_bL/c^2m_e=\pi I_bL/\beta_bI_cy_b$ for a/L=0.8, b/L=1.0, d/L=6.0, h/L=0.8, and $\beta_b=0.08$.

Figure 12:
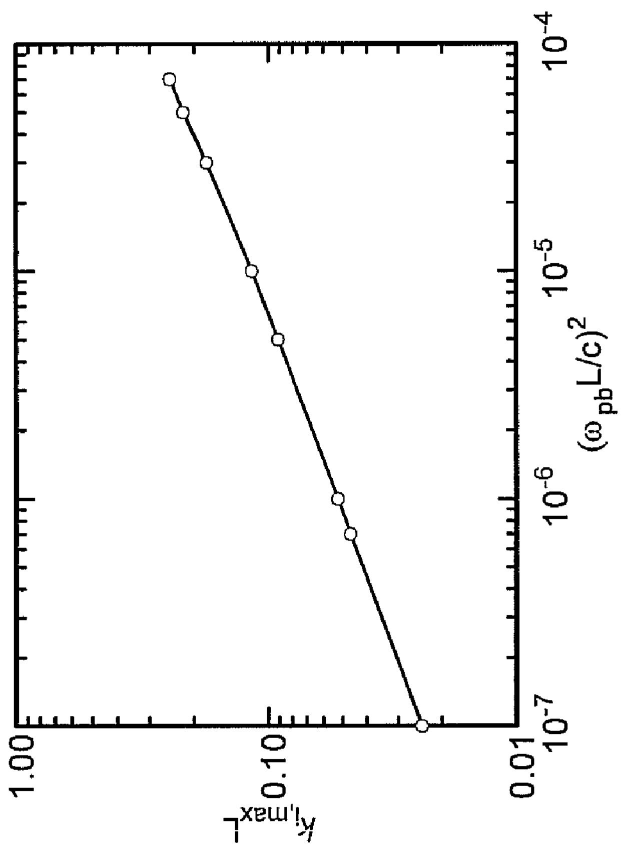
FIG. 12 is a graph demonstrating the maximum spatial growth of the lowest anti-symmetric mode as a function of normalized beam current.

FIG. 12 shows the maximum spatial growth $k_{i,max}=-[\text{Im}(k_z)]_{max}$ of the lowest anti-symmetric mode as a function of normalized beam current $\omega_{pb}^2L^2/c^2=4\pi e^2\sigma_bL/c^2m_e=\pi I_bL/\beta_bI_cy_b$ for the same parameters as in FIGS. 10A-10B. FIGS. 10A-10B and 11 show that both peak temporals and spatial growth rates increase with the beam current.

It is important to suppress any potential unwanted modes in a microwave amplifier. This is true for the PCRB TWA. In the PCRB TWA, two techniques are used to suppress unwanted modes.

One technique is use of a single-sided slow-wave structure instead of a double-sided slow-wave structure, which eliminates the symmetric modes in the operating band and higher frequency bands.

The other technique is use of photonic crystals. Typically, photonic crystals include periodic metallic structures (e.g., periodic metal rods) or periodic dielectric (e.g., periodic dielectric layers, rods or spheres) or a combination of periodic metallic and dielectric structures. They can be one-, two-, or three-dimensional.

When designed properly, a photonic crystal acts as a frequency-selective and/or mode-selective filter, which keeps the desired operating mode in the amplifier, and at same time, allows other modes, especially unwanted modes, to escape from the amplifier. In other words, the photonic crystal effectively damps the unwanted modes. The effectiveness of photonic crystals in both frequency selection and mode selection were demonstrated in an oscillator operating at high-frequencies and using an oversized cavity with its characteristic size greater than the wavelength, but it remains to be seen in amplifier configurations, especially for transverse size less than the wavelength.

Figure 13B:
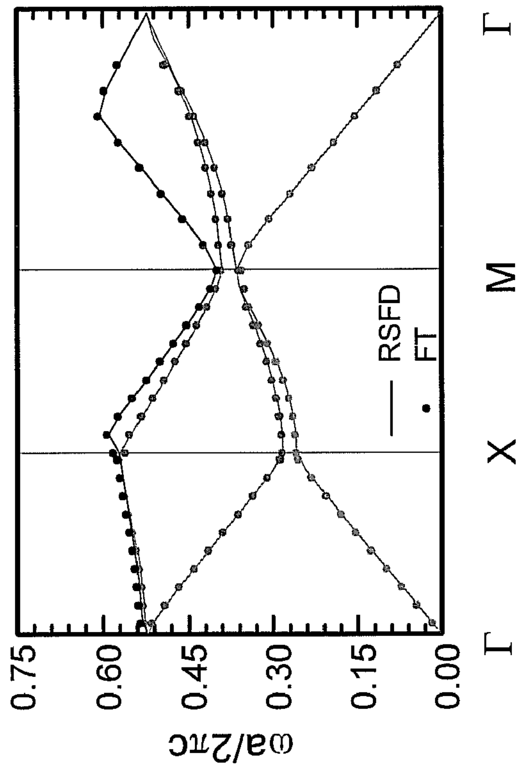
FIGS. 13A-13B is a graph demonstrating the dispersion characteristics in a two-dimensional dielectric photonic crystal.
Figure 13A:
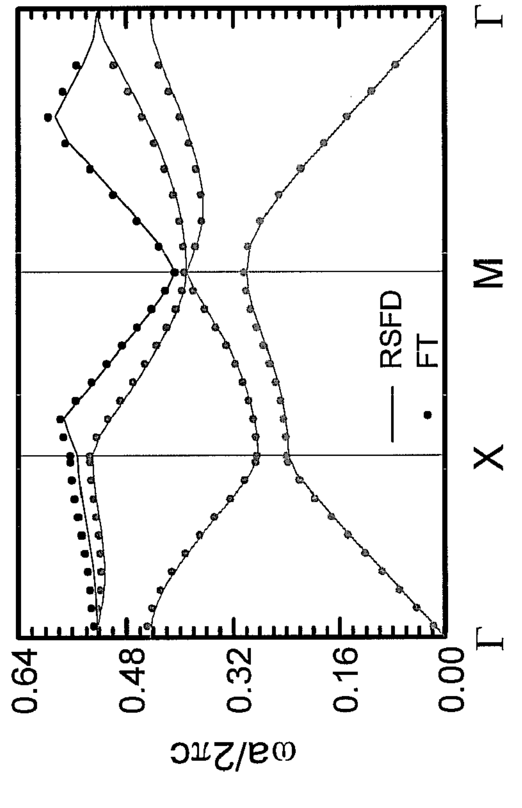

As an example, the dispersion characteristics of wave propagation in photonic crystals can be calculated using the latest Photonic Band Gap Structure Simulator (PBGSS) code developed at MIT. Shown in FIGS. 13A-13B is an example of the dispersion characteristics in a two-dimensional dielectric photonic crystal, where FIG. 13A shows the TM modes and FIG. 13B shows the TE modes, with the rod radius $r_0$ and the lattice period p, as calculated using the real-space finite-difference (RSFD) and Fourier transform (FT) methods. In this example, there is only a partial band gap at the X point. Here, $r_0/p=0.2$, $\epsilon_1=3.0$ for the rods, $\epsilon_2=8.9$ for the background, and a mesh of 21×21 cells and 13×13 plane waves are used in the PBGSS RSFD and FT calculations, respectively.

Figure 14:
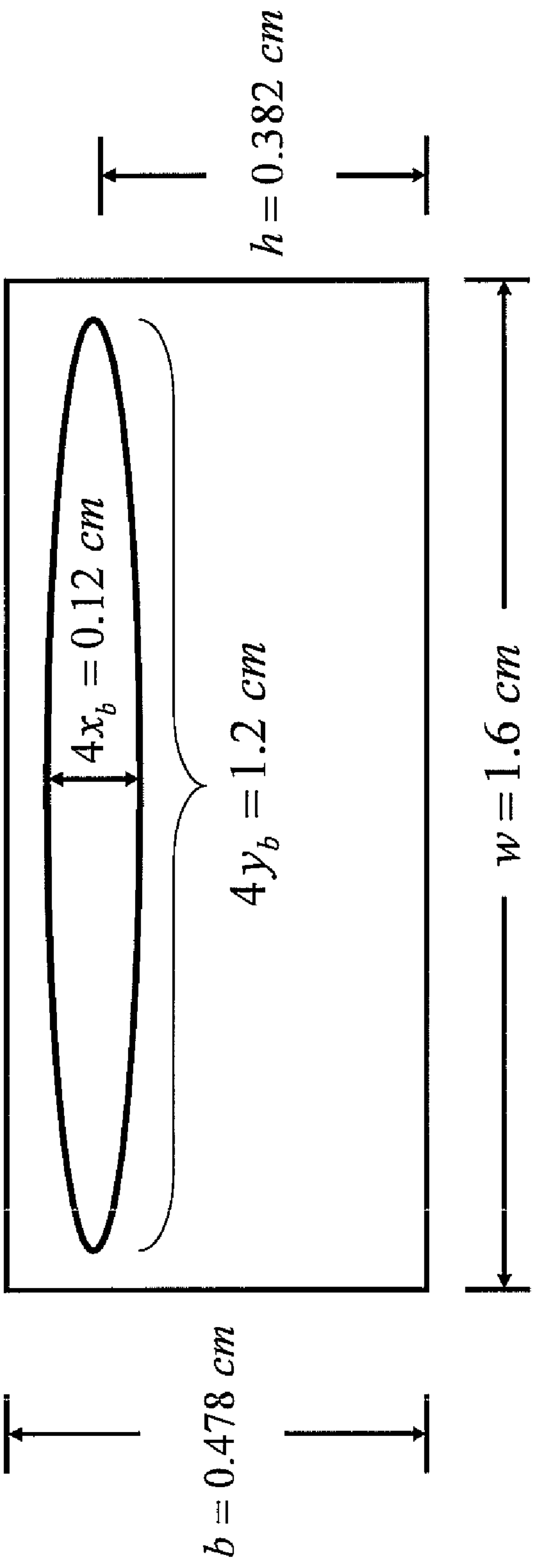
FIG. 14 is a schematic diagram of the design of the PCRB TWA for 3G wireless base stations.

The detailed concept design of the PCRB TWA for 3G wireless base stations. will focus on the frequency range from 1920 to 1980 MHz, which is used the initial rollout of 3G wireless network. The PCRB TWA is a 200W, 1950 MHz, 3% bandwidth structure. The parameters and design results are summarized in Table 1 and a cross-sectional view of the amplifier beam tunnel is shown in FIG. 14.

TABLE 1

| | |
|---|---|
| Circuit Parameters: | |
| Structure | Single-sided slow-wave structure |
| Axial Period | L = 0.478 cm |
| Slot Width | a = 0.382 cm |
| Slot Depth | d = 4.20 cm |
| Tunnel Height | b = 0.478 cm |
| Tunnel Width | w = 1.6 cm |
| Beam Parameters: | |
| Current | $I_b = 0.11$ A |
| Energy | $\frac{1}{2}m_e\beta_b^2c^2 = 2290\ \text{eV}\ (\beta_b = 0.0946)$ |
| Displacement | h = 0.378 cm |
| Full Height | $4x_b = 0.12\ \text{cm}\ \left(\frac{2x_b}{d-h} = 63\%\right)$ |
| Full Width | $4_{Yb} = 1.2$ cm |
| Beam Temperature | $\frac{1}{2}k_BT = 0.1\ \text{eV}$ |
| [Calculated Coupling Constant $\frac{\omega_{pb,eff}^2L^2}{c^2} \equiv \frac{4\pi e^2\sigma_bL}{m_ec^2} = \frac{\pi I_bL}{I_Ay_b} = 3.4\times10^{-4}$ with $\frac{I_A}{\beta_b} \equiv \frac{m_ec^3}{e} = 17\ \text{kA and}\ I_b = 4e\sigma_by_b\beta_bc$] | |
| Wiggler Field Parameters: | |
| $B_w = 207$ G | |
| $\lambda_w = 2L = 0.956$ cm | |
| Results of Gain Calculation: | |
| Center Frequency | f = 1950 MHz |
| Full Bandwidth | Δf/f = 3.1% |
| Gain | G = 1.6-3.1 dB/period(3.4-6.6 dB/cm) |
| Efficiency | η = 80% |
| Photonic Crystal: | |
| Structure | Dielectric square lattice |
| Band Gap Width | 100 MHz |

Figure 15:
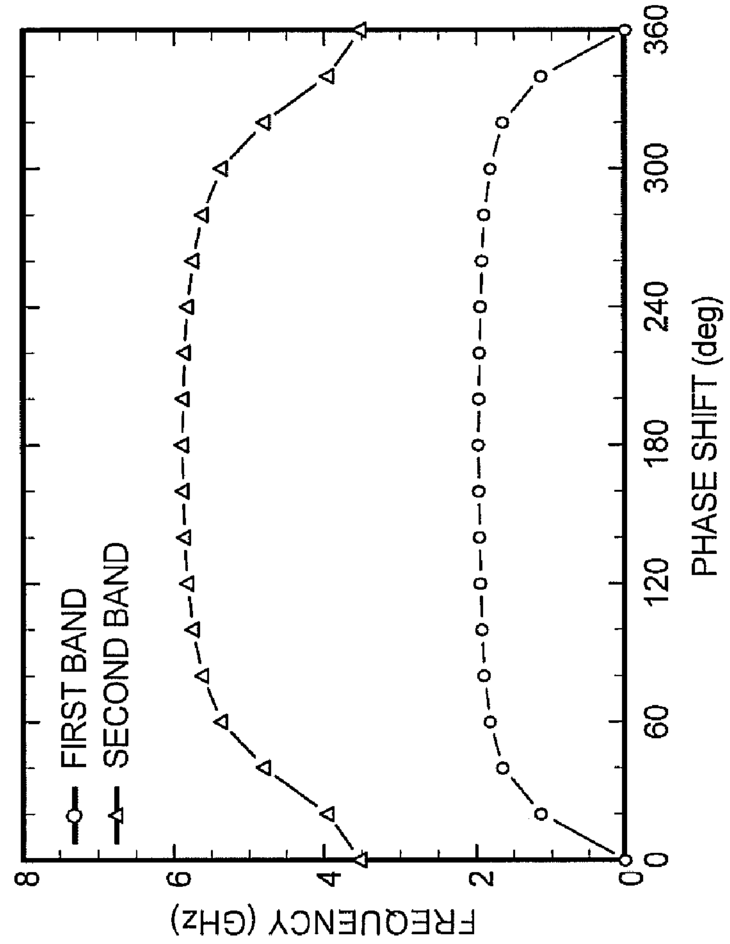
FIG. 15 is a graph of the eigenfrequency versus the phase shift for the two lowest bands in the 200 W, 1950 MHz, 3% bandwidth PCRB TWA structure.

Shown in FIG. 15 is a plot of the eigenfrequency versus the phase shift for the two lowest bands in the 200 W, 1950 MHz, 3% bandwidth PCRB TWA, as calculated analytically using Eq. 27 with the RF circuit parameters listed in Table 1.

The ribbon electron beam is designed to interact with the lowest band at about 120° phase shift to achieve RF signal amplification. Using the loaded dispersion relation in Eq. 104 and the parameters listed in Table 1, the complex wavenumber $k_z$ is calculated using the GAIN code. The results are summarized in FIGS. 16-19.

Figure 16:
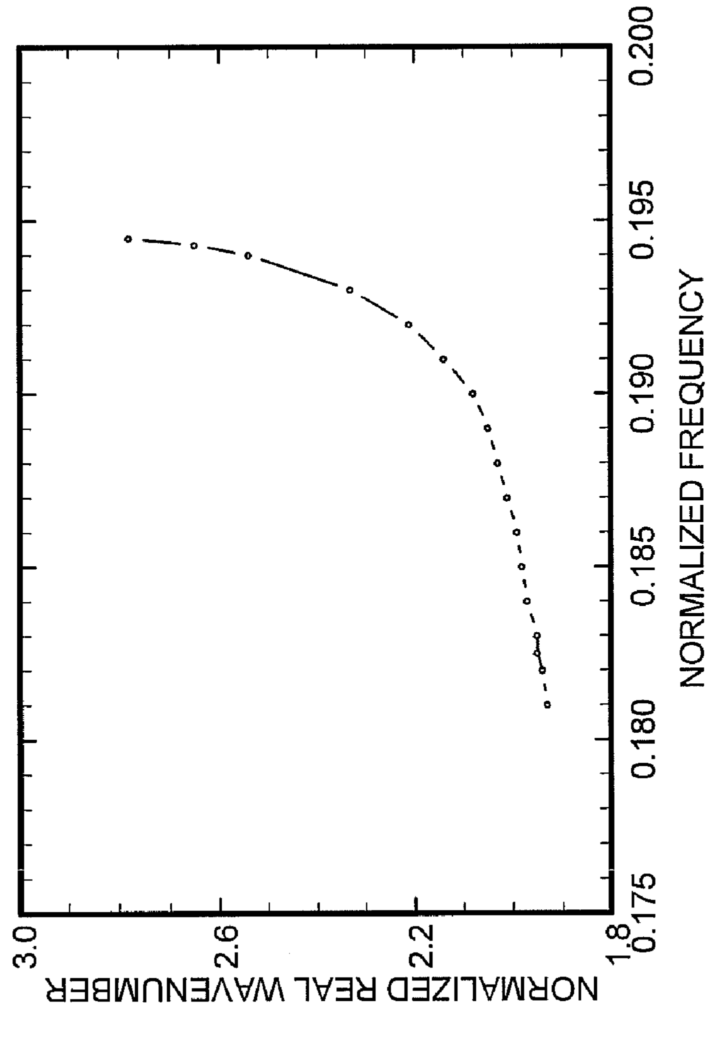
FIG. 16 is a graph of the normalized real wavenumbers $\mathrm{Re}k_zL$ versus the normalized frequency for the operating mode in the 200 W, 1950 MHz, 3% bandwidth PCRB TWA structure.
Figure 17:
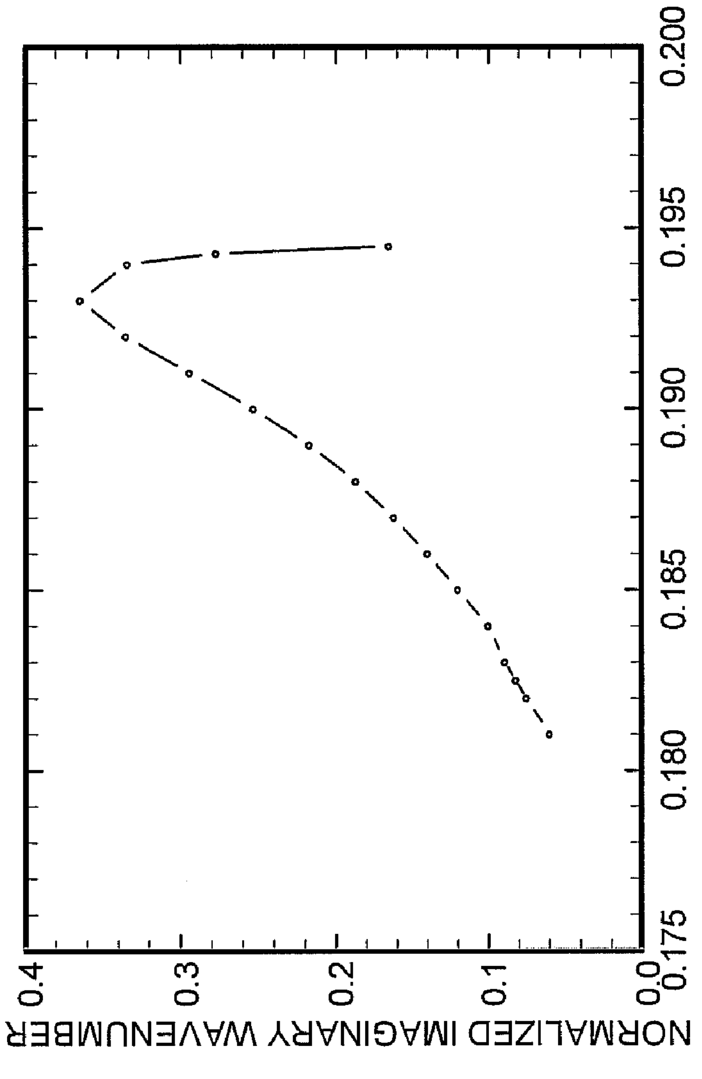
FIG. 17 is a graph of the normalized imaginary wavenumbers $|\mathrm{Im}k_zL|$ versus the normalized frequency for the operating mode in the 200 W, 1950 MHz, 3% bandwidth PCRB TWA structure.

Shown in FIGS. 16 and 17 are plots of the normalized real and imaginary wavenumbers $\text{Re}k_zL$ and $|\text{Im}k_zL|$ versus the normalized frequency ωL/c for the operating mode in the 200 W, 1950 MHz, 3% bandwidth PCRB TWA, respectively. In terms of the normalized imaginary wavenumber $|\text{Im}k_zL|$, the small-signal intensity gain per axial period is expressed as $$G = 10\log_{10}^{e^{2|\text{Im}k_zL|}} \cong 8.69|\text{Im}k_zL|\ \frac{\text{dB}}{\text{Period}}. \qquad \text{Eq. 130}$$

Figure 18:
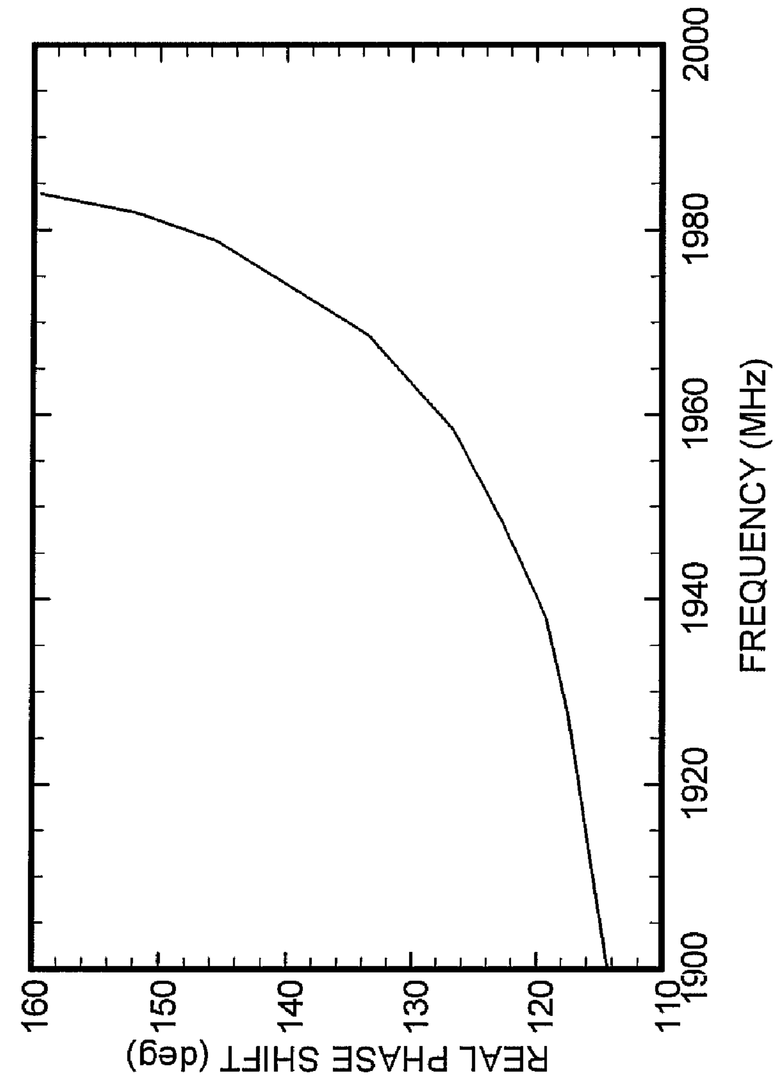
FIG. 18 is a graph of the real phase shift $\mathrm{Re}k_zL$ versus the frequency f for the operating mode.
Figure 19:
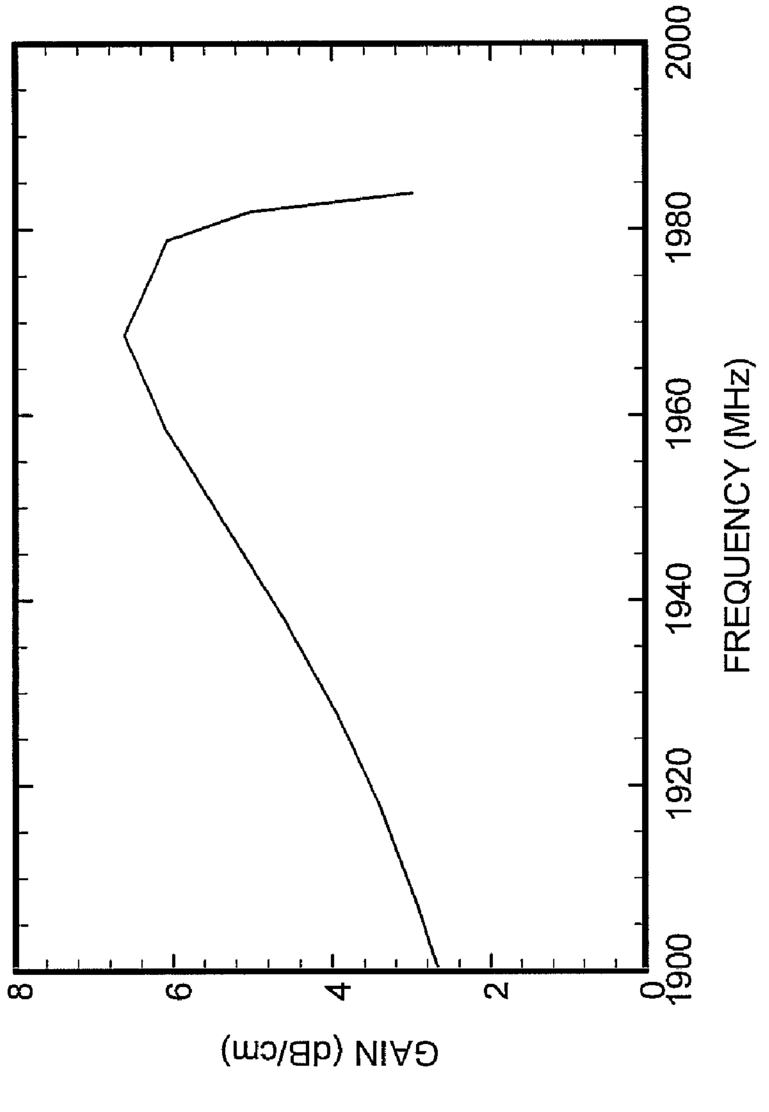
FIG. 19 is a graph of the gain G versus the frequency f for the operating mode.

Shown in FIGS. 18 and 19 are plots of the real phase shift $\text{Re}k_zL$ and the gain G versus the frequency f for the operating mode. In the 3% bandwidth from 1920 MHz to 1980 MHz, the gain is between 3.4 dB/cm and 6.6 dB/cm, which is adequate. It should be point out that the gain curve can be made flat by optimizing the RF circuit, so that the beam interacts it at a smaller value of the phase shift. This has been demonstrated in parametric design studies but will not be further discussed in this report.

As the ribbon electron beam interacts with the RF circuit, unwanted modes may be excited. Such unwanted modes could arise from the second or higher bands in the RF circuit. If not suppressed, they could cause the amplifier to self-oscillate. One promising technique to suppress unwanted modes is use of frequency-selective and mode-selective photonic crystals as described herein. There are various photonic crystals, ranging from one- to three-dimensional. For the purpose of illustration, two-dimensional dielectric square lattices are discussed.

Figure 20:
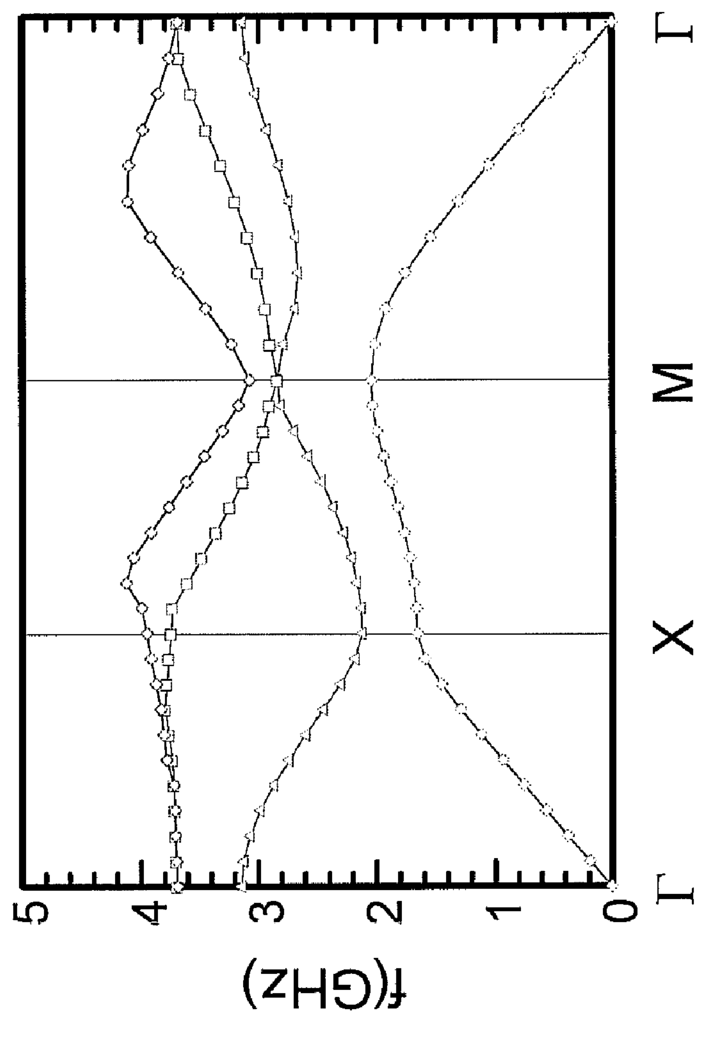
FIG. 20 is a graph demonstration the dispersion characteristics for 4 lowest-order TM modes in a photonic crystal.

FIG. 20 show the dispersion characteristics for 4 lowest-order TM modes in a photonic crystal consisting of a dielectric square lattice with rod radius $r_0=0.9$ cm, lattice constant a=4.9 cm, rod dielectric constant $\epsilon_1=2.3$, and background dielectric constant $\epsilon_2=8.9$. Labels Γ, X, and M on the horizontal axis follows the conversion in solid state physics. In this design, there is a narrow band gap of 100 MHz at 2 GHz, but no band gaps at lower or higher frequencies. This 100 MHz band gap will confine the operating mode and simultaneously allow all unwanted modes to transmit through, achieving the single-mode operation of the 200 W, 1950 MHz, 3% bandwidth PCRB TWA.

The photonic crystal design can still be optimized with larger values of dielectric constants and smaller lattice constants.

Because the PCRPB TWA is scalable to higher frequencies, wider bandwidth, and higher power output, the 1950 MHz PCRB TWA can be redesigned as a power amplifier for high-frequency (3-6 GHz) 3G wireless base stations as well as for future wireless base stations.

Although the present invention has been shown and described with respect to several preferred embodiments thereof, various changes, omissions and additions to the form and detail thereof, may be made therein, without departing from the spirit and scope of the invention.

What is claimed is:

1. A RF amplifier comprising:

a RF input section for receiving a RF input signal;

a RF amplification section with at least one single-sided slow-wave structure having at least one photonic crystal;

an electron ribbon beam that interacts with the RF input signal supported by said RF amplification section with at least one single-sided slow-wave structure having at least one photonic crystal so that the kinetic energy of said electron beam is transferred to the RF fields of said RF input signal, thus amplifying the RF input signal; and a RF output section that outputs said amplified RF input signal.

2. The RF amplifier of claim 1, wherein said at least one single-sided slow-wave structure comprises metallic or dielectric rods, dots and plates.

3. The RF amplifier of claim 1 further comprises wiggler magnets that focus said ribbon electron beam.

4. The RF amplifier of claim 1, wherein said at least one single-sided slow-wave structure is associated with said RF interaction section.

5. The RF amplifier of claim 1, wherein said ribbon electron beam comprises an aspect-ratio greater than unity.

6. The RF amplifier of claim 1, wherein said at least one photonic crystal comprises one photonic crystal.

7. The RF amplifier of claim 1, wherein said at least one photonic crystal comprises two photonic crystals.

8. The RF amplifier of claim 2, wherein said dielectric rods comprise a two-dimensional and/or three-dimensional dielectric lattice.

9. A method of forming a RF amplifier comprising:

forming a RF input section for receiving a RF input signal;

forming a RF amplification section with at least one single-sided slow-wave structure having at least one photonic crystal; and forming an electron ribbon beam that interacts with the RF input signal supported by said a RF amplification section with at least one single-sided slow-wave structure having at least one photonic crystal so that the kinetic energy of said electron beam is transferred to the RF fields of said RF input signal, thus amplifying the RF input signal; and forming a RF output section that outputs said amplified RF input signal.

10. The method of claim 9, wherein said at least one single-sided slow-wave structure comprises metallic or dielectric rods, dots and plates.

11. The method of claim 9 further comprises providing wiggler magnets that focus said ribbon electron beam.

12. The method of claim 9, wherein said at least one single-sided slow-wave structure is associated with said RF interaction section.

13. The method of claim 9, wherein said ribbon electron beam comprises an aspect ratio greater than unity.

14. The method of claim 9, wherein said at least one photonic crystal comprises one photonic crystal.

15. The method of claim 9, wherein said at least one photonic crystal comprises two photonic crystals.

16. The method of claim 10, wherein said dielectric rods comprise a two-dimensional and/or three-dimensional dielectric lattice.

* * * * *

UNITED STATES PATENT AND TRADEMARK OFFICE

CERTIFICATE OF CORRECTION

PATENT NO. : 7,538,608 B2
APPLICATION NO. : 10/870116
DATED : May 26, 2009
INVENTOR(S) : Chen et al.

It is certified that error appears in the above-identified patent and that said Letters Patent is hereby corrected as shown below:

In the Specification,

Column 1, lines 10-12, please delete the paragraph and insert the following new paragraph:

--This invention was made with Government support under Grant No. F49620-03-1-0230 awarded by the U.S. Air Force Office of Scientific Research and under Grant No. DE-FG02-91ER40648 awarded by the U.S. Department of Energy. The government has certain rights in the invention.--

Signed and Sealed this
Tenth Day of February, 2015

Michelle K. Lee
*Deputy Director of the United States Patent and Trademark Office*